United States Patent
Lee et al.

(10) Patent No.: US 9,768,190 B2
(45) Date of Patent: Sep. 19, 2017

(54) SEMICONDUCTOR MEMORY DEVICES HAVING VERTICAL PILLARS THAT ARE ELECTRICALLY CONNECTED TO LOWER CONTACTS

(71) Applicants: TaeHee Lee, Suwon-si (KR); Kyoung-Hoon Kim, Seoul (KR); Hongsoo Kim, Seongnam-si (KR)

(72) Inventors: TaeHee Lee, Suwon-si (KR); Kyoung-Hoon Kim, Seoul (KR); Hongsoo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/963,280

(22) Filed: Dec. 9, 2015

(65) Prior Publication Data
US 2017/0040336 A1  Feb. 9, 2017

(30) Foreign Application Priority Data
Aug. 7, 2015  (KR) .................. 10-2015-0111751

(51) Int. Cl.
*H01L 29/792* (2006.01)
*H01L 27/11582* (2017.01)
(52) U.S. Cl.
CPC .............. *H01L 27/11582* (2013.01)
(58) Field of Classification Search
None
See application file for complete search history.

(56) References Cited

U.S. PATENT DOCUMENTS

| 7,679,108 | B2 | 3/2010 | Matsunaga et al. |
| 8,743,580 | B2 | 6/2014 | Liaw |
| 2008/0242008 | A1* | 10/2008 | Mokhlesi ............ H01L 27/115 438/129 |
| 2009/0166868 | A1 | 7/2009 | Lee et al. |
| 2011/0101494 | A1 | 5/2011 | Kim |
| 2011/0291172 | A1* | 12/2011 | Hwang ............ H01L 27/11578 257/314 |
| 2013/0003433 | A1 | 1/2013 | Hishida et al. |

(Continued)

FOREIGN PATENT DOCUMENTS

| KR | 1020070048817 A | 5/2007 |
| KR | 1020070058120 A | 6/2007 |

(Continued)

*Primary Examiner* — Calvin Choi
(74) *Attorney, Agent, or Firm* — Myers Bigel, P.A.

(57) ABSTRACT

A semiconductor memory device may include an electrode structure including a selection line on a substrate and word lines between the substrate and the selection line, vertical pillars penetrating the electrode structure and being connected to the substrate, sub-interconnections and bit lines sequentially stacked on and electrically connected to the vertical pillars, and lower contacts connecting the vertical pillars to the sub-interconnections. The selection line may include a plurality of selection lines separated from each other in a first direction by an insulating separation layer, and central axes of the lower contacts connected in common to one of the sub-interconnections may be shifted, in a second direction across the first direction and parallel to a top surface of the substrate, from central axes of the vertical pillars thereunder.

20 Claims, 32 Drawing Sheets

(56) References Cited

U.S. PATENT DOCUMENTS

| | | | |
|---|---|---|---|
| 2013/0154055 A1* | 6/2013 | Park | H01L 27/0805 257/532 |
| 2014/0097484 A1* | 4/2014 | Seol | H01L 29/42332 257/324 |
| 2014/0187029 A1* | 7/2014 | Seol | H01L 29/42332 438/586 |
| 2014/0264525 A1 | 9/2014 | Takahashi et al. | |
| 2015/0035065 A1 | 2/2015 | Park et al. | |
| 2015/0054058 A1 | 2/2015 | Seol et al. | |
| 2015/0092472 A1 | 4/2015 | Yi et al. | |

FOREIGN PATENT DOCUMENTS

| | | |
|---|---|---|
| KR | 1020140083668 A | 7/2014 |
| KR | 1020150026054 A | 3/2015 |

\* cited by examiner

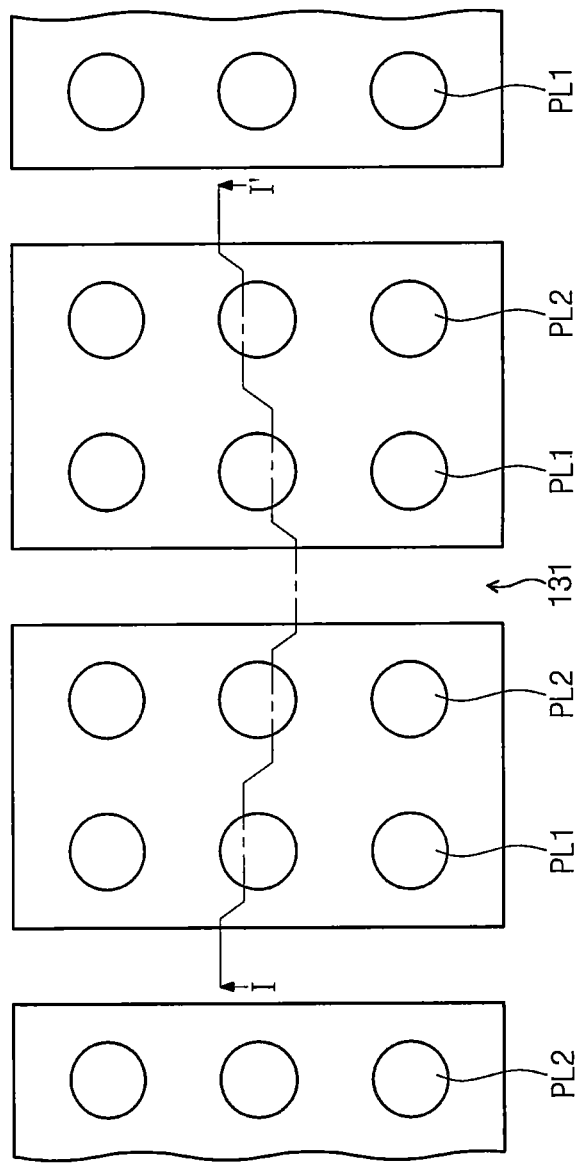

SEMICONDUCTOR MEMORY DEVICES HAVING VERTICAL PILLARS THAT ARE ELECTRICALLY CONNECTED TO LOWER CONTACTS

CROSS-REFERENCE TO RELATED APPLICATIONS

This U.S. non-provisional patent application claims priority under 35 U.S.C. §119 to Korean Patent Application No. 10-2015-0111751, filed on Aug. 7, 2015 in the Korean Intellectual Property Office, the entire content of which is incorporated by reference herein.

BACKGROUND OF THE INVENTION

Example embodiments of the inventive concepts relate to semiconductor devices, and in particular, to semiconductor memory devices having a vertical memory cell structure.

Higher integration of semiconductor devices is desired to satisfy consumer demands for high performance at low prices. In the case of semiconductor memory devices, the integration density of the device is an important factor in determining the price thereof. In the case of conventional two-dimensional semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional semiconductor memory devices.

SUMMARY

Example embodiments of the inventive concepts provide semiconductor memory devices which may have improved reliability and can be fabricated by a simplified process.

According to example embodiments of the inventive concepts, a semiconductor memory device may include a substrate having an upper surface that extends in a first direction and in a second direction that is perpendicular to the first direction; a first electrode structure and a second electrode structure on the upper surface of the substrate that are spaced apart from each other along the second direction; a plurality of vertical pillars that comprise a first set of vertical pillars and a second set of vertical pillars, the vertical pillars in the first set penetrating through the first electrode structure and the vertical pillars in the second set penetrating through the second electrode structure; a plurality of lower contacts that vertically overlap and electrically connect to respective ones of the vertical pillars; and a plurality of sub-interconnections that electrically connect respective ones of the vertical pillars in the first set to respective ones of the vertical pillars in the second set. In such embodiments, central axes of the lower contacts may be offset from central axes of the respective vertical pillars that the lower contacts vertically overlap.

In some embodiments, the semiconductor memory device may further include a plurality of bit lines extending in the second direction; and a plurality of upper contacts that electrically connect respective ones of the sub-interconnections to respective ones of the bit lines, where the sub-interconnections may extend in the second direction and include respective protruding portions.

In some embodiments, the plurality of sub-interconnections may comprise a first plurality of sub-interconnections and the plurality of vertical pillars may comprise a first plurality of vertical pillars, and the semiconductor memory device may further include a third electrode structure on the upper surface of the substrate that is spaced apart from the second electrode structure in the second direction, the second electrode structure being between the first electrode structure and the third electrode structure; a second plurality of vertical pillars that comprise a third set of vertical pillars and a fourth set of vertical pillars, the vertical pillars in the third set penetrating through the second electrode structure and the vertical pillars in the fourth set penetrating through the third electrode structure; and a second plurality of sub-interconnections that electrically connect respective ones of the vertical pillars in the third set to respective ones of the vertical pillars in the fourth set.

In some embodiments, the protruding portion of a first of the sub-interconnections in the first plurality of sub-interconnections may extend in the first direction, and the protruding portion of a first of the sub-interconnections in the second plurality of sub-interconnections may extend in a direction opposite the first direction.

In some embodiments, the central axes of first and second of the lower contacts that vertically overlap respective first and second of the vertical pillars that are electrically connected to a first of the sub-interconnections may be offset from the central axes of the respective first and second of the vertical pillars in the first direction, and the central axes of third and fourth of the lower contacts that vertically overlap respective third and fourth of the vertical pillars that are electrically connected to a second of the sub-interconnections may be offset from the central axes of the respective third and fourth of the vertical pillars in a direction opposite the first direction.

In some embodiments, the vertical pillars in the first set may be aligned along a first imaginary line in the first direction and the vertical pillars in the second set may be aligned along a second imaginary line in the first direction that is spaced apart in the second direction from the first imaginary line.

In some embodiments, a central axis of a first of the lower contacts may extend in a third direction that is perpendicular to the first and second directions may intersect a central axis of a first of the sub-interconnections that is electrically connected to the first of the lower contacts, where the central axis of the first of the sub-interconnections may extend in a plane defined by the first and second directions.

In some embodiments, a central axis of a first of the lower contacts may extend in a third direction that is perpendicular to the first and second directions and may be offset in the first direction from a central axis of a first of the sub-interconnections that is electrically connected to the first of the lower contacts, where the central axis of the first of the sub-interconnections may extend in a plane defined by the first and second directions.

In some embodiments, the sub-interconnections may be spaced apart from each other in the first direction, and a first of the sub-interconnections may have a first length in the second direction and a second of the sub-interconnections that is adjacent the first of the sub-interconnections may have a second length in the second direction that is greater than the first length. In such embodiments, the first of the sub-interconnections may be electrically connected to a first of the vertical pillars through a first of the lower contacts and the second of the sub-interconnections may be electrically connected to a second of the vertical pillars through a second of the lower contacts, and a central axis of the first of the vertical pillars may be offset from a central axis of the first of the lower contacts by a first distance and a central axis of the second of the vertical pillars may be offset from a central axis of the second of the lower contacts by a second distance, wherein the first distance is greater than the second distance.

In some embodiments, the semiconductor memory device may further include an insulating separation structure that extends in the first direction that separates the first electrode structure from the second electrode structure, and the protruding portions of the sub-interconnections may vertically overlap the insulating separation structure.

In some embodiments, each of the sub-interconnections may extend in a straight line in the second direction.

In some embodiments, the central axes of first and second of the lower contacts that vertically overlap respective first and second of the vertical pillars that are electrically connected to a first of the sub-interconnections may be offset from the central axes of the respective first and second of the vertical pillars in the first direction, and the protruding portion of the first of the sub-interconnections may extend in the first direction.

In some embodiments, a first of the sub-interconnections in the first plurality of sub-interconnections may be adjacent a first of the sub-interconnections in the second plurality of sub-interconnections in the second direction, and the first of the sub-interconnections in the first plurality of sub-interconnections may be electrically connected to a first of the bit lines and the first of the sub-interconnections in the second plurality of sub-interconnections may be electrically connected to a second of the bit lines that is adjacent the first bit line.

In some embodiments, a first of the vertical pillars in the first set of vertical pillars may include a first column that vertically penetrates the first electrode structure, a second column that vertically penetrates the first electrode structure, and a horizontal segment that electrically connects the first column to the second column.

In some embodiments, the central axes of the lower contacts may be offset from the central axes of the respective vertical pillars that the lower contacts vertically overlap in both the first direction and the second direction.

In some embodiments, the sub-interconnections may be spaced apart from each other in the first direction, and a first portion of a first of the sub-interconnections may vertically overlap the first electrode structure and a second portion of the first of the sub-interconnections may vertically overlap the second electrode structure, the first portion of the first of the sub-interconnections having a first length and the second portion of the first of the sub-interconnections having a second length that exceeds the first length, and a first portion of a second of the sub-interconnections that is adjacent the first of the sub-interconnections may vertically overlap the first electrode structure and a second portion of the second of the sub-interconnections may vertically overlap the second electrode structure, the first portion of the second of the sub-interconnections having a third length and the second portion of the first of the sub-interconnections having a fourth length that is less than the third length. In some embodiments, the first length may be substantially equal to the fourth length and the second length may be substantially equal to the third length.

In some embodiments, the semiconductor memory device may further include a first insulating separation structure that extends in the first direction that separates the first electrode structure from the second electrode structure; a second insulating separation structure that extends in the first direction that separates the second electrode structure from the third electrode structure; and a plurality of dummy vertical pillars that penetrate the second insulating separation structure. The first insulating separation structure may not include any dummy vertical pillars.

According to example embodiments of the inventive concepts, a semiconductor memory device may include a substrate having an upper surface that extends in a first direction and in a second direction that is perpendicular to the first direction; a plurality of vertical pillars that extend above the substrate in a third direction that is perpendicular to the first and second directions, the vertical pillars aligned in a row that extends in the second direction; a plurality of lower contacts that vertically overlap and electrically connect to respective ones of the vertical pillars; and a first bit line and a second bit line, the first and second bit lines each extending in the second direction and spaced apart from each other in the first direction. A first subset of the lower contacts that are electrically connected to the first bit line may be aligned in a first row that extends in the second direction and a second subset of the lower contacts that are electrically connected to the second bit line may be aligned in a second row that extends in the second direction, the first row being spaced apart from the second row in the first direction.

In some embodiments, central axes of the lower contacts may be offset from central axes of the respective vertical pillars that the lower contacts vertically overlap.

In some embodiments, the vertical pillars may be arranged in pairs, and the semiconductor memory device may further include a plurality of sub-interconnections that electrically connect the first vertical pillar of a respective pair to the second vertical pillar of the respective pair.

In some embodiments, the sub-interconnections that are electrically connected to the first bit line may include respective protruding portions that extend in a direction opposite the first direction and the sub-interconnection that are electrically connected to the second bit line may include respective protruding portions that extend in the first direction.

In some embodiments, central axes of the lower contacts that are electrically connected to the first bit line may be offset from central axes of the respective vertical pillars that the lower contacts vertically overlap in a direction opposite the first direction and central axes of the lower contacts that are electrically connected to the second bit line may be offset from central axes of the respective vertical pillars that the lower contacts vertically overlap in the first direction.

In some embodiments, a central axis of a first of the lower contacts may extend in the third direction and may intersect a central axis of a first of the sub-interconnections that is electrically connected to the first of the lower contacts, the central axis of the first of the sub-interconnections extending in a plane defined by the first and second directions.

In some embodiments, a central axis of a first of the lower contacts may extend in the third direction and may be offset in the first direction from a central axis of a first of the sub-interconnections that is electrically connected to the first of the lower contacts, the central axis of the first of the sub-interconnections extending in a plane defined by the first and second directions.

In some embodiments, the sub-interconnections may be spaced apart from each other in the first direction, and a first of the sub-interconnections may have a first length in the second direction and a second of the sub-interconnections that is adjacent the first of the sub-interconnections may have a second length in the second direction that may be greater than the first length.

In some embodiments, the first of the sub-interconnections may be electrically connected to a first of the vertical pillars through a first of the lower contacts and the second of the sub-interconnections may be electrically connected to a second of the vertical pillars through a second of the lower contacts, and a central axis of the first of the vertical pillars may be offset from a central axis of the first of the lower contacts by a first distance and a central axis of the second of the vertical pillars may be offset from a central axis of the second of the lower contacts by a second distance, where the first distance may be greater than the second distance.

According to example embodiments of the inventive concepts, a semiconductor memory device may include a substrate having an upper surface; and a memory cell array, the memory cell array comprising a plurality of vertical pillars that extend upwardly above the substrate and a plurality of lower contacts that vertically overlap and electrically connect to respective ones of the vertical pillars. Central axes of the lower contacts may be offset from central axes of the respective vertical pillars that the lower contacts vertically overlap, and the central axis of a first of the lower contacts that is located in a first region of the memory cell array may be offset from the central axis of the vertical pillar that the first of the lower contacts vertically overlaps by a first distance and the central axis of a second of the lower contacts that is located in a second region of the memory cell array may be offset from the central axis of the vertical pillar that the second of the lower contacts vertically overlaps by a second distance that is different than the first distance.

In some embodiments, the first region may be central region of the memory cell array and the second region may be an edge region of the memory cell array.

In some embodiments, the second distance may exceed the first distance.

In some embodiments, the vertical pillars may be arranged in pairs, and the semiconductor memory device may further include a plurality of sub-interconnections that respectively electrically connect the first vertical pillar of a respective pair to the second vertical pillar of the respective pair.

In some embodiments, the sub-interconnections may include respective protruding middle portions that may be offset from end portions thereof in the same direction that the central axes of the lower contacts that are electrically connected to the respective sub-interconnections are offset from the central axes of the respective vertical pillars that the lower contacts respectively vertically overlap.

In some embodiments, the semiconductor memory device may further include a plurality of bit lines; and a plurality of upper contacts that electrically connect respective ones of the sub-interconnections to respective ones of the bit lines.

In some embodiments, the semiconductor memory device may further include a first electrode structure and a second electrode structure on the upper surface of the substrate that are spaced apart from each other and a plurality of sub-interconnections, where the plurality of vertical pillars may comprise a first set of vertical pillars that penetrate through the first electrode structure and a second set of vertical pillars that penetrate through the second electrode structure. The sub-interconnections may electrically connect respective ones of the vertical pillars in the first set to respective ones of the vertical pillars in the second set.

In some embodiments, the plurality of sub-interconnections may comprise a first plurality of sub-interconnections and the plurality of vertical pillars may comprise a first plurality of vertical pillars, and the semiconductor memory device may further include a third electrode structure on the upper surface of the substrate that is spaced apart from the second electrode structure, the second electrode structure being between the first electrode structure and the third electrode structure; a second plurality of vertical pillars that comprise a third set of vertical pillars and a fourth set of vertical pillars, the vertical pillars in the third set penetrating through the second electrode structure and the vertical pillars in the fourth set penetrating through the third electrode structure; and a second plurality of sub-interconnections that electrically connect respective ones of the vertical pillars in the third set to respective ones of the vertical pillars in the fourth set.

In some embodiments, the protruding portion of a first of the sub-interconnections in the first plurality of sub-interconnections and the protruding portion of a first of the sub-interconnections in the second plurality of sub-interconnections may extend in opposite directions.

In some embodiments, the central axes of the lower contacts that vertically overlap respective vertical pillars that are electrically connected to a first of the sub-interconnections may be offset from the central axes of the vertical pillars that they vertically overlap in a first direction, and the central axes of the lower contacts that vertically overlap respective vertical pillars that are electrically connected to a second of the sub-interconnections may be offset from the central axes of the respective vertical pillars that they vertically overlap in a direction opposite the first direction.

In some embodiments, the sub-interconnections may be spaced apart from each other in a first direction, and a first of the sub-interconnections may have a first length in a second direction that is perpendicular to the first direction and a second of the sub-interconnections that is adjacent the first of the sub-interconnections may have a second length in the second direction that is greater than the first length.

In some embodiments, an insulating separation structure may separate the first electrode structure from the second electrode structure, and the protruding portions of the sub-interconnections may vertically overlap the insulating separation structure.

According to example embodiments of the inventive concepts, a semiconductor memory device may include an electrode structure including a selection line on a substrate and word lines between the substrate and the selection line, the word lines extending in a first direction, vertical pillars penetrating the electrode structure and being connected to the substrate, sub-interconnections and bit lines sequentially stacked on and electrically connected to the vertical pillars, and lower contacts connecting the vertical pillars to the sub-interconnections. Central axes of the lower contacts connected in common to one of the sub-interconnections may be shifted, in a second direction across the first direction and parallel to a top surface of the substrate, from central axes of the vertical pillars thereunder.

In some embodiments, the selection line may include a plurality of selection lines, which are separated from each other in the first direction parallel to the top surface of the substrate by an insulating separation layer. The insulating separation layer may include a first insulating separation layer and a second insulating separation layer separated from each other in the first direction, and at least one of the first and second insulating separation layers may be used to separate the word lines from each other in the first direction.

In some embodiments, the sub-interconnections may include a first sub-interconnection overlapped with the first insulating separation layer and a second sub-interconnection overlapped with the second insulating separation layer, and the central axes of the lower contacts connected to the second sub-interconnection may be shifted from the central axes of the vertical pillars thereunder to have a shift direction opposite to that of the central axes of the lower contacts connected to the first sub-interconnection.

In some embodiments, one of the first and second insulating separation layers may be provided to have a bottom surface higher than a top surface of the uppermost one of the word lines. Each of the vertical pillars may include a conductive pattern and a memory layer exposed through a top surface thereof, the memory layer may be provided to enclose a sidewall of the conductive pattern, and the lower contacts may be spaced apart from the memory layer. At least one of the sub-interconnections may include a protruding portion protruding in a direction, in which the lower contacts are shifted.

In some embodiments, the insulating separation layer may include a first insulating separation layer and a second insulating separation layer spaced apart from each other in the first direction. The sub-interconnections may include first sub-interconnections overlapped with the first insulating separation layer and second sub-interconnections overlapped with the second insulating separation layer, and the protruding portions of the second sub-interconnections may be protruded in a direction opposite to a protrusion direction of the protruding portions of the first sub-interconnections. The insulating separation layer may include a plurality of insulating separation layers spaced apart from each other in the first direction, the protruding portions of the sub-interconnections on the odd-numbered insulating separation layer may be protruded in a direction opposite to a protrusion direction of the protruding portions of the sub-interconnections on the even-numbered insulating separation layer. Here, the second direction may be substantially perpendicular to the first direction.

In some embodiments, the semiconductor memory device includes a cell array region provided with the vertical pillars and a peripheral circuit region provided near at least one side of the cell array region, the cell array region may include a center region positioned at a center thereof and an edge region adjacent to the peripheral circuit region, in a plan view, and a shift distance of the lower contacts on the edge region may be greater than that on the center region.

In some embodiments, when viewed in a plan view, central axes of the sub-interconnections may be shifted in the second direction from centers of top surfaces of the lower contacts. The lower contacts may be arranged to form first and second columns disposed adjacent to each other and parallel to the second direction, and when viewed in a plan view, the lower contacts constituting the first column may be shifted in the second direction from the lower contacts constituting the second column. In certain embodiments, the sub-interconnections may include first sub-interconnections connected to the lower contacts constituting the first column and second sub-interconnections connected to the lower contacts constituting the second column, and the first sub-interconnections may be longer than the second sub-interconnections. The sub-interconnections may include protruding portions protruding in a direction, in which the lower contacts are shifted, and a shift distance of the lower contacts connected to the second sub-interconnections may be longer than a shift distance of the lower contacts connected to the first sub-interconnections. The protruding portions of the first sub-interconnections may be more protruded than the protruding portions of the second sub-interconnections.

In some embodiments, the lower contacts may be arranged to form a plurality of columns, which are parallel to the second direction and are arranged in the first direction. The sub-interconnections may include a first sub-interconnection connecting a pair of the lower contacts, which constitute a pair of adjacent odd-numbered ones of the columns spaced apart from each other by the insulating separation layer interposed therebetween, in a one-to-one manner, and a second sub-interconnection connecting a pair of the lower contacts, which constitute a pair of adjacent even-numbered ones of the columns spaced apart from each other by the insulating separation layer interposed therebetween, in a one-to-one manner.

According to example embodiments of the inventive concept, a semiconductor memory device may include electrode structures, which are spaced apart from each other in a first direction by a first insulating separation layer interposed therebetween, and each of which includes electrodes sequentially stacked on a substrate, vertical pillars penetrating the electrode structures and being connected to the substrate, sub-interconnections and bit lines sequentially stacked on and electrically connected to the vertical pillars, and lower contacts connecting the vertical pillars to the sub-interconnections. Each of the sub-interconnections may provide an electrical path between a pair of the vertical pillars spaced apart from each other in the first direction, and when viewed in a plan view, a central axis of each of the sub-interconnections may be space apart from centers of top surfaces of the pair of the vertical pillars in a second direction crossing the first direction and centers of the lower contacts on the pair of the vertical pillars may be shifted from the centers of the top surfaces of the pair of the vertical pillars in the second direction.

According to example embodiments of the inventive concept, a semiconductor memory device may include electrode structures, which are spaced apart from each other in a first direction by a first insulating separation layer interposed therebetween, and each of which includes electrodes sequentially stacked on a substrate, vertical pillars penetrating the electrode structures and being connected to the substrate, sub-interconnections and bit lines stacked on the vertical pillars and electrically connected to the vertical pillars, and lower contacts connecting the vertical pillars to the sub-interconnections. Each of the sub-interconnections may be connected to a pair of the lower contacts spaced apart from each other in the first direction and may include a protruding portion protruding in a second direction crossing the first direction, and central axes of the lower contacts may be shifted, in the second direction, from central axes of the vertical pillars.

In some embodiments, the lower contacts may be arranged to form a plurality of columns, which may be parallel to the second direction and may be arranged in the first direction, and the central axes of the lower contacts constituting each of the columns may be shifted in the same direction.

In some embodiments, the electrodes may include a string selection line on the substrate and word lines between the substrate and the string selection line. The semiconductor memory device may further include a second insulating separation layer, which may be spaced apart from the first insulating separation layer in the first direction and separates the string selection line into a plurality of string selection lines spaced apart from each other in the first direction, and the second insulating separation layer may have a bottom surface higher than a top surface of the uppermost one of the word lines.

In some embodiments, the vertical electrodes may include dummy vertical electrodes penetrating the second insulating separation layer and being connected to the substrate, and the lower contacts may be not provided between the dummy vertical electrodes and the sub-interconnections.

In some embodiments, the first and second insulating separation layers may be alternately disposed in the first direction, central axes of the lower contacts connected to the sub-interconnections vertically overlapped with the first insulating separation layer may be respectively shifted in the second direction from central axes of the vertical pillars thereunder, central axes of the lower contacts connected to the sub-interconnections vertically overlapped with the second insulating separation layer may be respectively shifted, in an opposite direction of the second direction, from central axes of the vertical pillars thereunder.

In some embodiments, the lower contacts coupled to each of the string selection lines may be provided to form first to fourth columns, which are parallel to the second direction and are sequentially arranged in the first direction.

In some embodiments, central axes of the lower contacts constituting the first and second columns may be respectively shifted, in the second direction, from central axes of the vertical pillars thereunder, central axes of the lower contacts constituting the third and fourth columns may be respectively shifted, in an opposite direction of the second direction, from central axes of the vertical pillars thereunder.

In some embodiments, each of the sub-interconnections connected to the lower contacts constituting the first and second columns extends from the lower contacts to the first insulating separation layer, and each of the sub-interconnections connected to the lower contacts constituting the third and fourth columns extends from the lower contacts to the second insulating separation layer. The sub-interconnections connected to the lower contacts constituting the second and third columns may be longer than the sub-interconnections connected to the lower contacts constituting the first and fourth columns.

BRIEF DESCRIPTION OF THE DRAWINGS

Example embodiments will be more clearly understood from the following brief description taken in conjunction with the accompanying drawings, which illustrate non-limiting, example embodiments as described herein.

FIGS. 14A through 19A are plan views illustrating a process of fabricating a semiconductor memory device according to example embodiments of the inventive concepts.

FIGS. 14B through 19B are sectional views taken along lines I-I' of FIGS. 14A through 19A, respectively.

Figure 1:
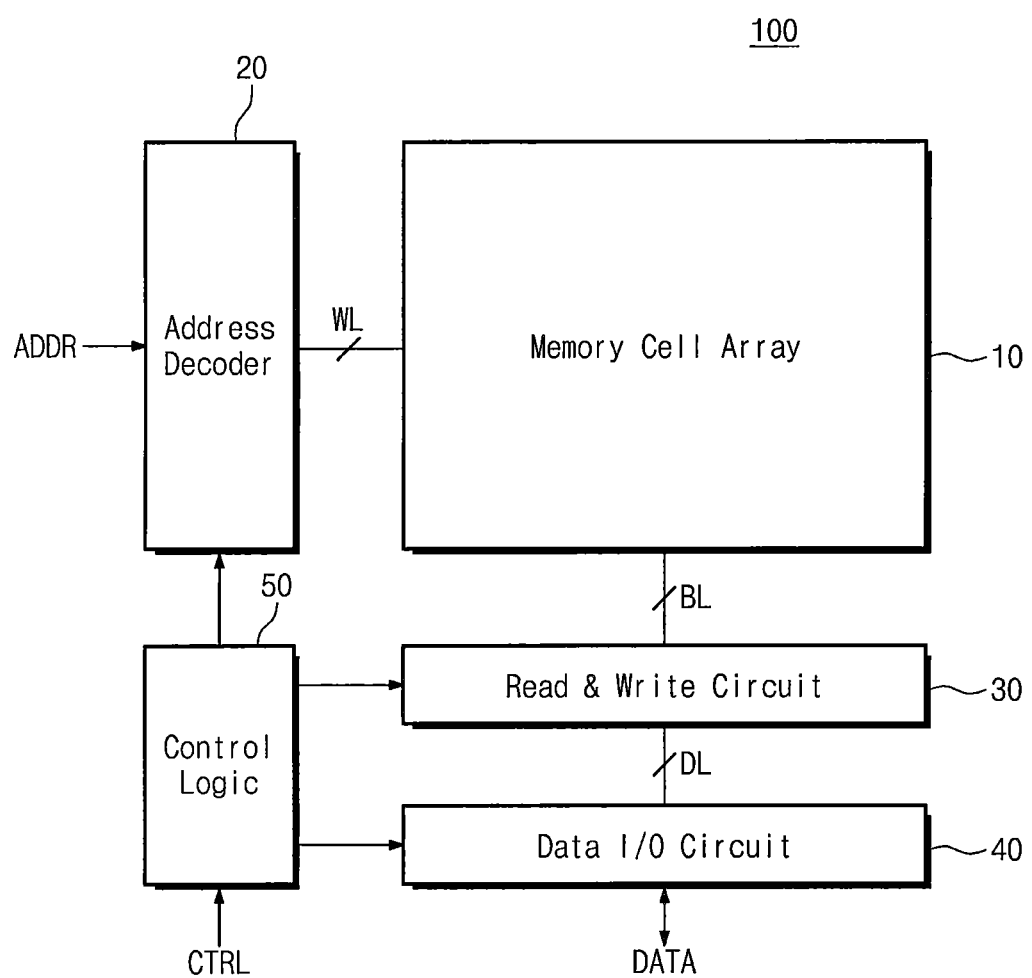
FIG. 1 is a block diagram illustrating a semiconductor memory device according to example embodiments of the inventive concepts.

The above-described figures are intended to illustrate the general characteristics of example embodiments and to supplement the written description provided below. These drawings, however, are not necessarily to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof. As used herein the term "and/or" includes any and all combinations of one or more of the associated listed items.

The devices and methods of forming devices according to various embodiments described herein may be embodied in microelectronic devices such as integrated circuits, where a plurality a devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device 100 according to example embodiments of the inventive concepts. Referring to FIG. 1, the semiconductor memory device 100 may include a memory cell array 10, an address decoder 20, a read/write circuit 30, a data input/output circuit 40, and a control logic 50.

The memory cell array 10 may be connected to the address decoder 20 via a plurality of word lines WL and may be connected to the read/write circuit 30 via a plurality of bit lines BL. The memory cell array 10 may include a plurality of memory cells. In some embodiments, the memory cell array 10 may be configured to allow for each cell to store one or more bits of data.

The address decoder 20 may be connected to the memory cell array 10 via the word lines WL. The address decoder 20 may operate in response to the control of the control logic 50. The address decoder 20 may receive an address ADDR from an external source. The address decoder 20 may decode a row address contained in the received address ADDR and may select a corresponding one of the word lines WL, based on the decoded row address. The address decoder 20 may decode a column address contained in the address ADDR and may transfer the decoded column address to the read/write circuit 30. The address decoder 20 may include elements such as a row decoder, a column decoder, and an address buffer.

The read/write circuit 30 may be connected to the memory cell array 10 via the bit lines BL and may be connected to the data input/output circuit 40 via data lines DL. The read/write circuit 30 may operate in response to the control of the control logic 50. The read/write circuit 30 may receive the decoded column address transferred from the address decoder 20. The read/write circuit 30 may select at least one of the bit lines BL using the decoded column address. For example, the read/write circuit 30 may be configured to receive data from the data input/output circuit 40 and/or to write the received data in the memory cell array 10. The read/write circuit 30 may be configured to read data from the memory cell array 10 and/or to transfer the read data to the data input/output circuit 40. The read/write circuit 30 may be configured to read data from a first storage region of the memory cell array 10 and then to write the read data to a second storage region of the memory cell array 10. For example, the read/write circuit 30 may be configured to perform a copy-back operation.

In some embodiments, the read/write circuit 30 may include electronic elements, such as a page buffer (or a page register) and a column selection circuit. In certain embodiments, the read/write circuit 30 may include electronic elements, such as a sensing amplifier, a write driver, and a column selection circuit.

The data input/output circuit 40 may be connected to the read/write circuit 30 via the data lines DL. The data input/output circuit 40 may operate in response to the control of the control logic 50. The data input/output circuit 40 may exchange data DATA with an external source. The data input/output circuit 40 may transfer the data DATA to the read/write circuit 30 via the data lines DL. The data input/output circuit 40 may output the data DATA, which is transferred from the read/write circuit 30 through the data lines DL, to the external source. For example, the data input/output circuit 40 may include electronic elements such as a data buffer.

The control logic 50 may be connected to the address decoder 20, the read/write circuit 30, and the data input/output circuit 40. The control logic 50 may control the operation of the semiconductor memory device 100. The control logic 50 may operate in response to a control signal CTRL transferred from an external source.

Figure 2:
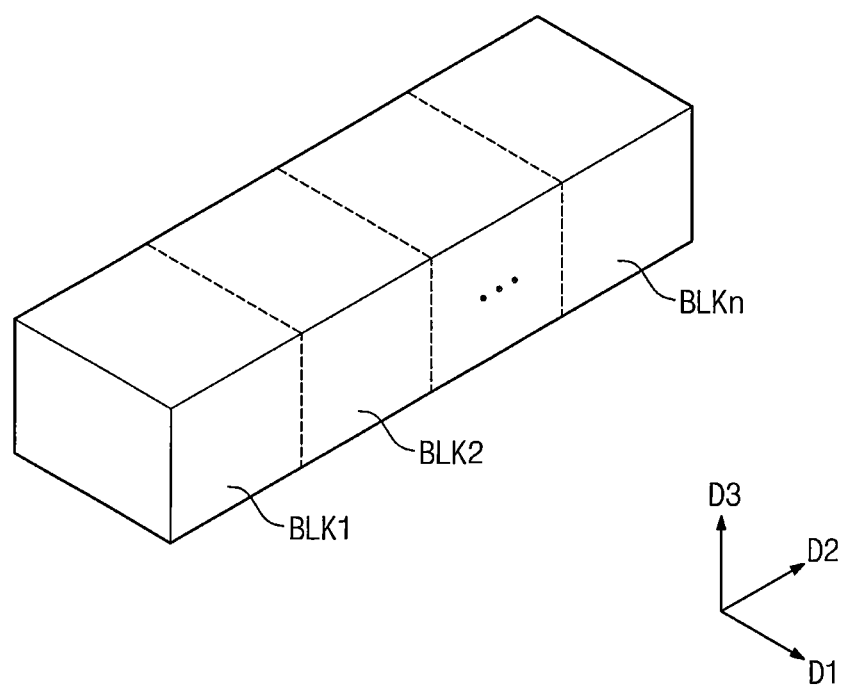
FIG. 2 is a block diagram illustrating an example of a memory cell array of FIG. 1.

FIG. 2 is a block diagram illustrating an example of the memory cell array 10 of FIG. 1. Referring to FIG. 2, the memory cell array 10 may include a plurality of memory blocks BLK1 to BLKn. Each of the memory blocks BLK1 to BLKn may have a three-dimensional (3D) structure, which is also referred to as a vertical structure. Each of the memory blocks BLK1 to BLKn may include structures extending in first, second, and third directions D1, D2, and D3 that cross each other. In some embodiments, each of the memory blocks BLK1 to BLKn may include a plurality of cell strings extending in the third direction D3.

Figure 3:
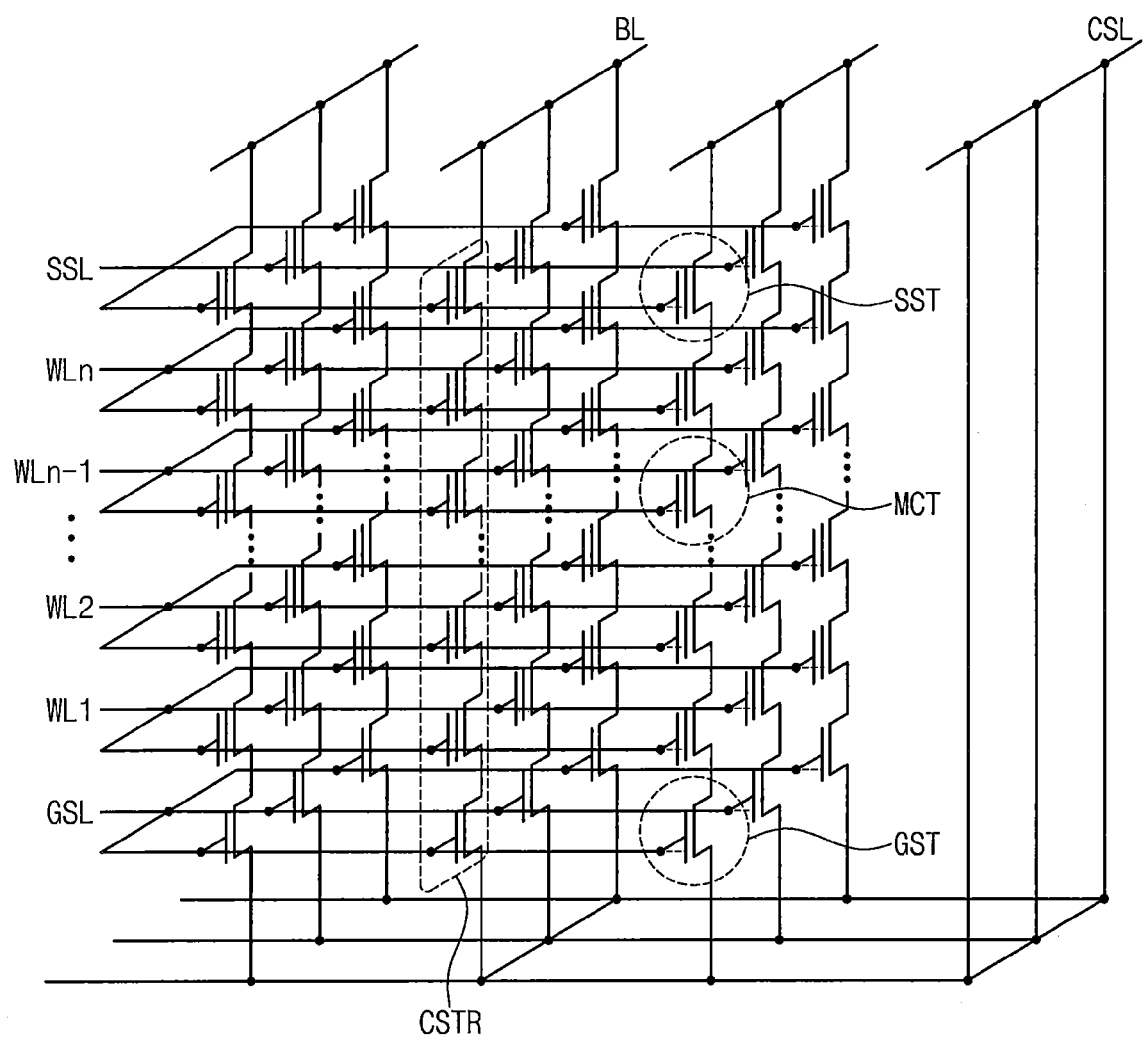
FIG. 3 is a circuit diagram schematically illustrating a portion of one of the memory blocks of FIG. 2.

FIG. 3 is a circuit diagram schematically illustrating a portion of one of the memory blocks of FIG. 2. Referring to FIG. 3, the memory block may include a common source line CSL, a plurality of bit lines BL, and a plurality of cell strings CSTR, which are disposed between the common source line CSL and the bit lines BL. Some of the cell strings CSTR may be connected in parallel to each of the bit lines BL.

Each of the cell strings CSTR may include a ground selection transistor GST that is coupled to the common source line CSL, a string selection transistor SST that is coupled to a corresponding one of the bit lines BL, and a plurality of memory cell transistors MCT that are interposed between the ground and string selection transistors GST and SST. The ground selection transistor GST, the memory cell transistors MCT, and the string selection transistor SST may be connected in series between the common source line CSL and the bit line BL. Each of the cell strings CSTR may further include a ground selection line GSL, a plurality of word lines WL1-WLn, and a string selection line SSL, which are respectively used as gate electrodes of the ground selection transistor GST, the memory cell transistors MCT, and the string selection transistor SST.

Figure 4:
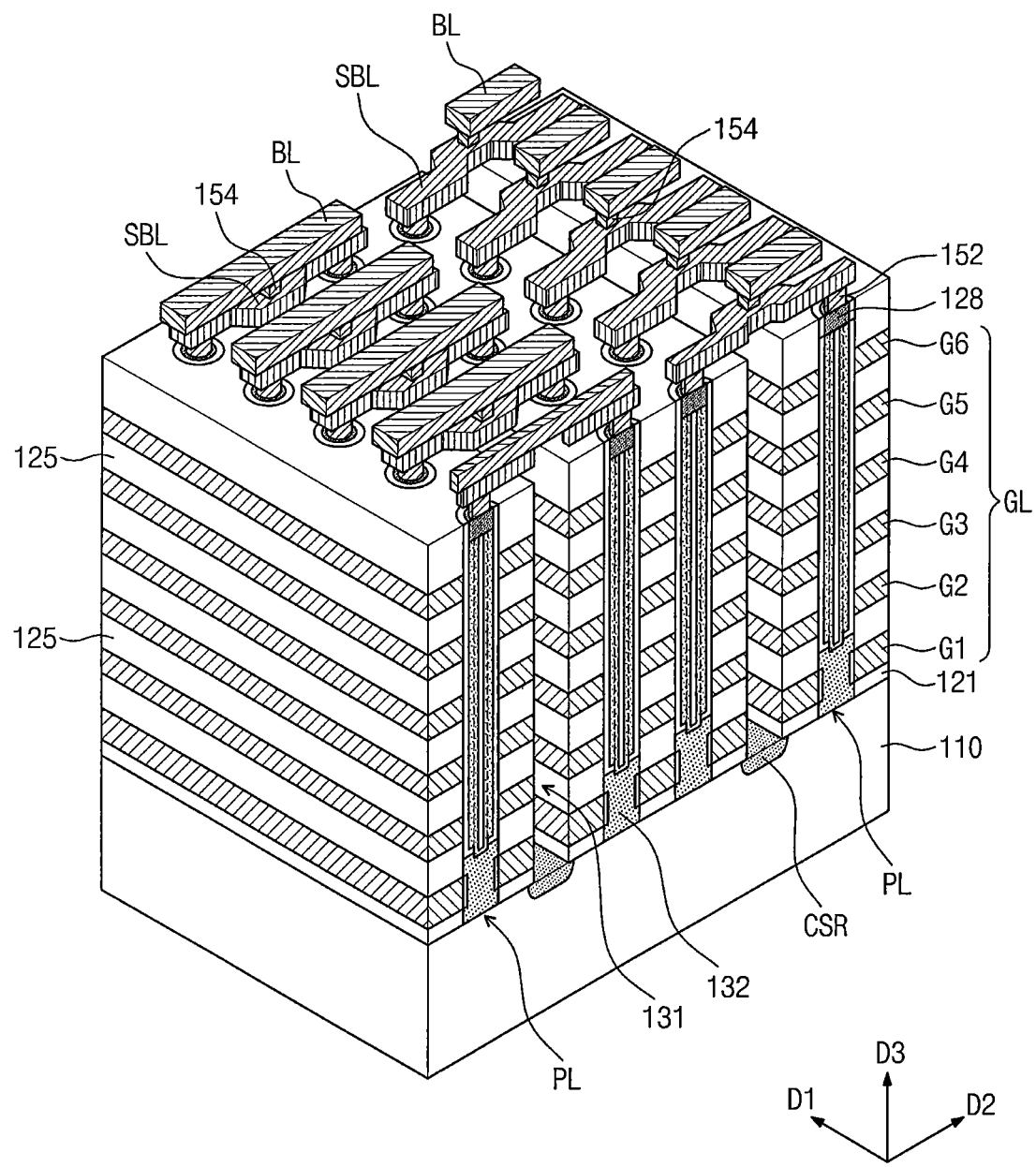
FIG. 4 is a perspective view illustrating a portion of a semiconductor memory device according to example embodiments of the inventive concepts.
Figure 5A:
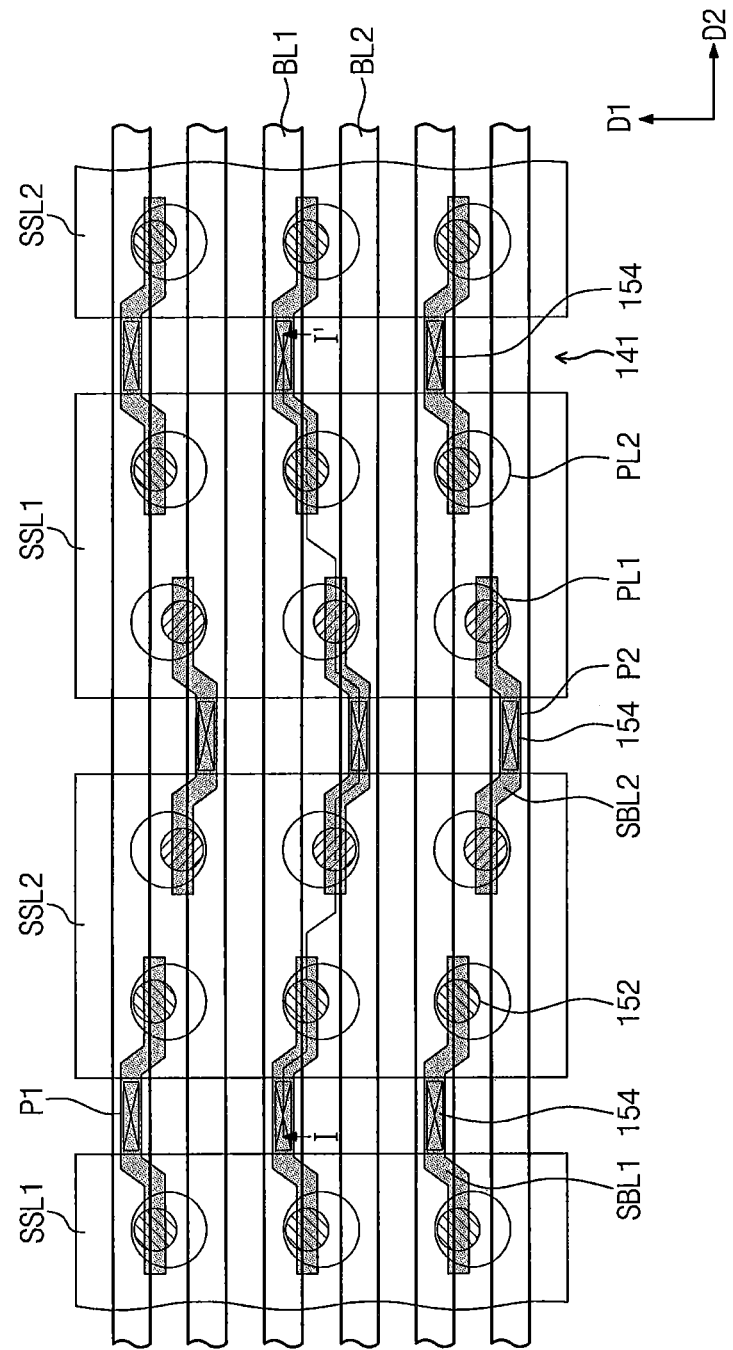
FIG. 5A is a plan view illustrating another portion of the semiconductor memory device of FIG. 4.
Figure 5B:
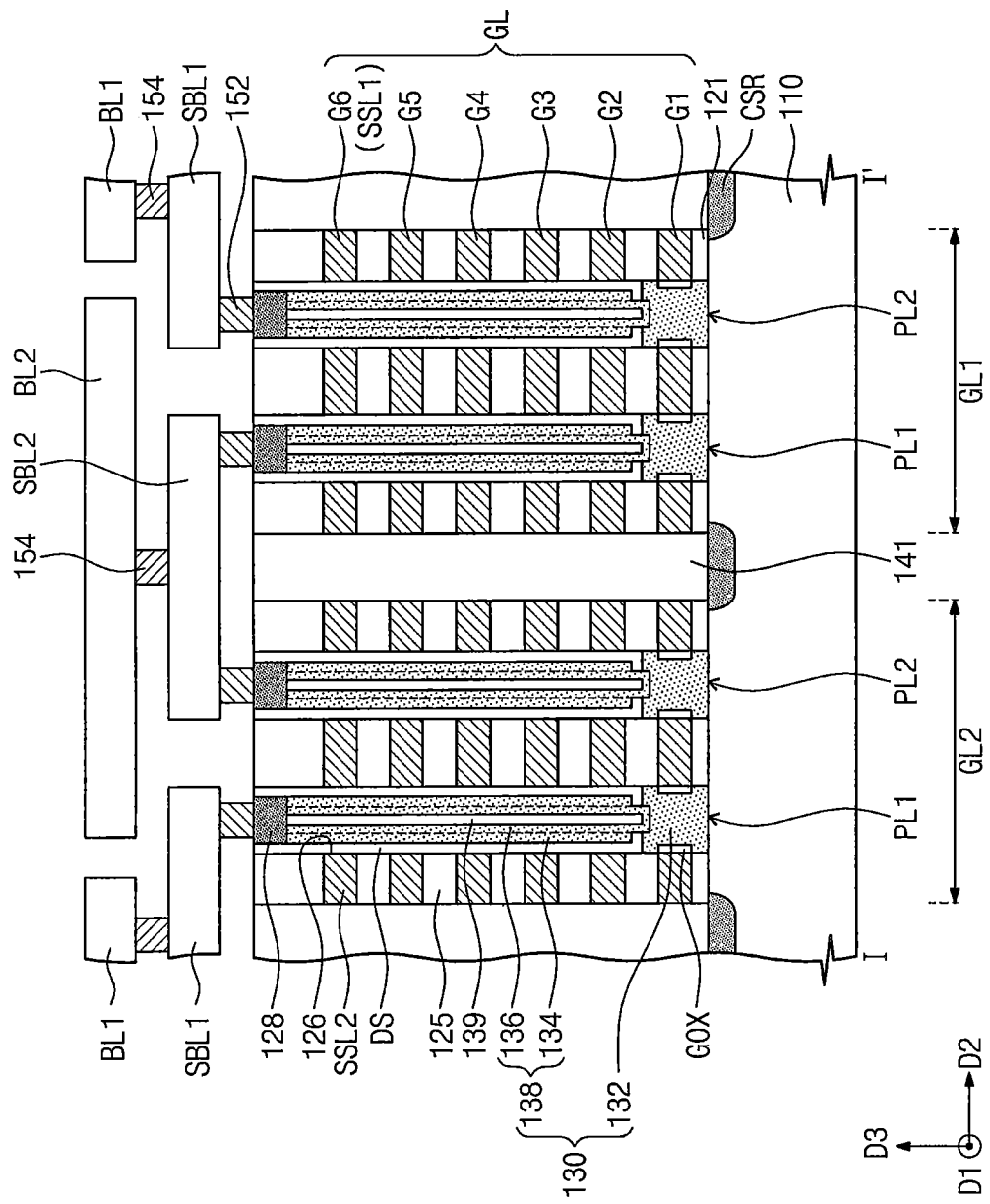
FIG. 5B is a sectional view taken along line I-I' of FIG. 5A.

FIG. 4 is a perspective view illustrating a portion of a semiconductor memory device according to example embodiments of the inventive concepts. FIG. 5A is a plan view of the semiconductor memory device of FIG. 4. FIG. 5B is a sectional view taken along line I-I' of FIG. 5A. FIGS. 4 and 5A-51B illustrate the same general portion of the semiconductor memory device, but FIG. 4 illustrates a larger portion of the device along direction D1 while FIGS. 5A-5B illustrate a larger portion of the device along direction D2 in order to more clearly illustrate the relative configuration of the sub-interconnections and the bit lines that are described in detail below. Note also that in FIG. 4 portions of the bit lines and certain insulating separation layers are removed to more clearly illustrate various underlying structures.

Referring to FIGS. 4, 5A, and 5B, a substrate 110 may be provided. The substrate 110 may be a semiconductor substrate having a first conductivity type (e.g., p-type). The semiconductor substrate 110 may include, for example, at least one selected from the group consisting of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer. A buffer dielectric layer 121 may be provided on the substrate 110. The buffer dielectric layer 121 may comprise a silicon oxide layer.

A plurality of electrode structures GL may be provided on the buffer dielectric layer 121. The electrode structures GL may extend in the first direction D1. The electrode structures GL may be spaced apart from each other in a second direction D2, which is perpendicular to the first direction D1, by a separation trench 131 that extends in the first direction D1.

Each electrode structure GL may include first to sixth gate electrodes G1-G6, which are sequentially stacked in a third direction D3 that is perpendicular to a top surface of the substrate 110. The third direction D3 may also be perpendicular to the first direction D1 and the second direction D2. Insulating patterns 125 may be provided between the first to sixth gate electrodes G1-G6 so that the insulating patterns and the first to sixth gate electrodes G1-G6 are alternately stacked in the third direction D3. In an exemplary embodiment, the lowermost gate electrode (i.e., the first gate electrode G1) may serve as a gate electrode (e.g., the ground selection line GSL of FIG. 3) of a ground selection transistor, and the uppermost gate electrode (i.e., the sixth gate electrode G6) may serve as a gate electrode (e.g., the string selection line SSL of FIG. 3) of the string selection transistor. The remaining gate electrodes positioned between the first and sixth gate electrodes G1 and G6 may serve as cell gate electrodes (e.g., the word lines WL1-WLn of FIG. 3).

The insulating patterns 125 may comprise a silicon oxide layer. The buffer dielectric layer 121 may be thinner than the insulating patterns 125. The gate electrodes G1-G6 may comprise at least one of doped silicon, metals (e.g., tungsten), metal nitrides, or metal suicides. The drawings exemplarily illustrate the electrode structure GL with six gate electrodes, but the number of stacked gate electrodes in the electrode structure GL is not limited to six.

Vertical pillars PL may penetrate the electrode structures GL and may be connected to the substrate 110. The vertical pillars PL may be provided in vertical holes 126 that penetrate the electrode structures GL, the insulating layers 125 and the buffer dielectric layer 121 to expose the substrate 110. Each of the vertical pillars PL may include a semiconductor pattern 130 that is provided in a respective one of the vertical holes 126. The semiconductor pattern 130 may serve as a channel region of at least one metal-oxide-semiconductor (MOS) transistor. The semiconductor pattern 130 may include a first semiconductor pattern 132 that is provided at a lower region of the vertical hole 126 and a second semiconductor pattern 138 that is provided on the first semiconductor pattern 132. The first semiconductor pattern 132 may be a silicon layer grown by an epitaxial process. In some embodiments, at least a portion of the second semiconductor pattern 138 may comprise polysilicon. The first semiconductor pattern 132 may be in direct contact with the top surface of the substrate 110. The first semiconductor pattern 132 may have a top surface that is higher than a top surface of the first gate electrode G1 and lower than a bottom surface of the second gate electrode G2. The first semiconductor pattern 132 may serve as a channel region of a MOS transistor that is controlled by the first gate electrode G1. A gate oxide GOX may be provided between the first semiconductor pattern 132 and the first gate electrode G1. The gate oxide GOX may comprise, for example, a silicon oxide layer or a silicon-germanium oxide layer.

In certain embodiments, the vertical pillar PL may include a conductive pattern, instead of the semiconductor pattern 130. As an example, each of the vertical pillars PL may include at least one of conductive materials, such as doped semiconductor materials, metals, conductive metal nitrides, silicides, and nano structures (e.g., carbon nanotube or graphene).

The second semiconductor pattern 138 may be electrically connected to the substrate 110 through the first semiconductor pattern 132. In certain embodiments, the first semiconductor pattern 132 may be omitted, and the second semiconductor pattern 138 may directly contact the substrate 110. For the sake of simplicity, the description that follows will refer to an example of the present embodiment in which the first semiconductor pattern 132 is provided, but example embodiments of the inventive concepts are not limited thereto.

The second semiconductor pattern 138 may include an outer pattern 134 and an inner pattern 136. Each of the outer and inner patterns 134 and 136 may comprise, for example, polysilicon. The outer pattern 134 may be provided on a sidewall of the vertical hole 126. The inner pattern 136 may be provided on an inner sidewall of the outer pattern 134. The inner pattern 136 may be in direct contact with the top surface of the first semiconductor pattern 132. As an example, the inner pattern 136 may include a lower portion that extends into a recess in an upper surface of the first semiconductor pattern 132.

The second semiconductor pattern 138 may be shaped like a hollow cylinder (e.g., a macaroni). The lower end of this hollow cylinder shape may be closed by the lower portion of the inner pattern 136 that extends into the recess in the upper surface of the first semiconductor pattern 132. The second semiconductor pattern 138 may define an inner hole. The inner hole defined by the second semiconductor pattern 138 may be filled with an insulating gap-fill layer 139. The insulating gap-fill layer 139 may comprise a silicon oxide layer. A conductive pattern 128 may be provided on an upper end of the second semiconductor pattern 138. The conductive pattern 128 may comprise a doped semiconductor material or a metallic material. In some embodiments, the conductive pattern 128 may include the same material as the second semiconductor pattern 138. For example, the conductive pattern 128 may be a polysilicon layer.

A memory layer DS may be provided between the second to sixth gate electrodes G2-G6 and the semiconductor patterns 130. The memory layer DS will be described in more detail with reference to FIG. 20. As shown, the memory layer DS may not be provided between the first gate electrode G1 and the first semiconductor pattern 132, but in certain embodiments, the memory layer DS, instead of the gate oxide GOX, may be provided between the first gate electrode G1 and the first semiconductor pattern 132.

Figure 20:
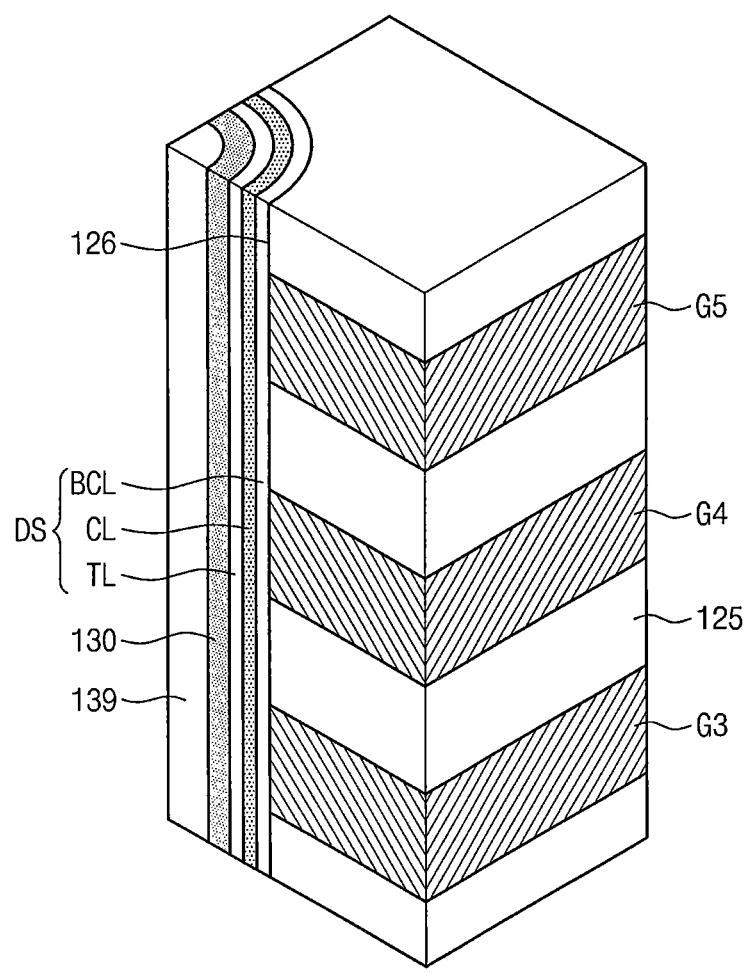
FIG. 20 is a perspective view schematically illustrating a memory layer according to example embodiments of the inventive concepts.

As shown in FIGS. 4, 5B and 20, the memory layer DS may include a blocking insulating layer BCL that is adjacent the gate electrodes G2-G6, a tunnel insulating layer TL that is adjacent the semiconductor pattern 130, and a charge storing layer CL therebetween. The blocking insulating layer BCL may comprise a high-k dielectric material (e.g., aluminum oxide or hafnium oxide). The blocking insulating layer BCL may be a multi-layered structure. For example, the blocking insulating layer BCL may include a first blocking insulating layer and a second blocking insulating layer. In some embodiments, at least one of the first and second blocking insulating layers may comprise aluminum oxide and/or hafnium oxide. At least a portion of the blocking insulating layer BCL (e.g., the first blocking insulating layer) may extend between the insulating patterns 125 and the semiconductor patterns 130. In certain embodiments, another portion (e.g., the second blocking insulating layer) of the blocking insulating layer BCL may extend between the insulating patterns 125 and the gate electrodes G1-G6.

The charge storing layer CL may comprise, for example, a charge trap layer or an insulating layer including conductive nano particles. The charge trap layer may include, for example, a silicon nitride layer. The charge storing layer CL may extend between the insulating patterns 125 and the semiconductor pattern 130. In some embodiments, at least a portion of the charge storing layer CL may extend between the insulating patterns 125 and the gate electrodes G1-G6.

The tunnel insulating layer TL may comprise a silicon oxide layer. The tunnel insulating layer TL may further include a high-k dielectric layer (e.g., hafnium oxide or aluminum oxide).

In certain embodiments, the memory layer DS may comprise a variable resistance pattern. The variable resistance pattern may include at least one of materials exhibiting a variable resistance property. Hereinafter, some examples of the variable resistance pattern for the memory layer DS will be described.

As an example, the memory layer DS may include a material (e.g., a phase-changeable material) having an electrical resistance that can be changed by the application of heat that is generated by passing an electric current through an electrode adjacent thereto. The phase-changeable material may be a material including at least one of antimony (Sb), tellurium (Te), or selenium (Se). For example, the phase-changeable material may include a chalcogenide formed of tellurium (Te) having about 20 to about 80 atomic percent concentration, antimony (Sb) having about 5 to about 50 atomic percent concentration, and germanium (Ge) having the remaining concentration. The phase-changeable material may further include at least one of N, O, C, Bi, In, B, Sn, Si, Ti, Al, Ni, Fe, Dy, or La, which serves as an impurity. In certain embodiments, the variable resistance pattern may be one of GeBiTe, InSb, GeSb, and GaSb.

As another example, the memory layer DS may have a layered structure, and an electrical resistance of the memory layer DS can be changed using a spin transfer phenomenon that occurs in response to an electric current flowing therethrough. For example, the memory layer DS may have a layered structure exhibiting a magneto-resistance property and may include at least one ferromagnetic material and/or at least one antiferromagnetic material.

As another example, the memory layer DS may include at least one of perovskite compounds or transition metal oxides. For example, the memory layer DS may include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide.

Referring back to FIGS. 4, 5A, and 5B, an insulating separation layer may be provided to divide the uppermost electrode (e.g., the sixth gate electrode G6) of the electrode structures GL into string selection lines SSL1 and SSL2, which are spaced apart from each other in the second direction D2. As an example, the insulating separation layer may be an insulating separation layer 141, which is provided to cut not only the sixth gate electrode G6 but also the first to fifth gate electrodes G1-G5 in the second direction D2 and to define the electrode structures GL. The insulating separation layer 141 may be provided in the separation trench 131, that penetrates the gate electrodes G1-G6 and the insulating patterns 125 to expose the top surface of the substrate 110. The insulating separation layer 141 may have a line-shaped structure that extends parallel to the first direction D1. The insulating separation layer 141 may comprise, for example, a silicon oxide layer.

Common source regions CSR may be provided in an upper surface of the substrate 110 below each insulating separation layer 141. The common source regions CSR may extend in the first direction D1 and may be spaced apart from each other in the second direction D2. The common source regions CSR may have a second conductivity type (e.g., n type) that is different from the first conductivity type.

Sub-interconnections SBL1 and SBL2 and bit lines BL1 and BL2 may be sequentially provided on the vertical pillars PL. The sub-interconnections SBL1 and SBL2 may be physically and electrically connected to the vertical pillars PL through lower contacts 152. The sub-interconnections SBL1 and SBL2 may be connected to top surfaces of the conductive patterns 128, which are formed on or in top portions of the vertical pillars PL. The bit lines BL1 and BL2 may be connected to the sub-interconnections SBL1 and SBL2 through upper contacts 154.

Hereinafter, a relative configuration of the lower contacts 152, the sub-interconnections SBL1 and SBL2, and the bit lines BL1 and BL2 will be described in more detail with reference to FIGS. 5A and 5B.

As shown in FIG. 5B, the electrode structures GL may include first and second electrode structures GL1 and GL2, which are adjacent each other. In the following description, the sixth gate electrode G6 of the first electrode structure GL1 will be referred to as a "first string selection line SSL1", and the sixth gate electrode G6 of the second electrode structure GL2 will be referred to as a "second string selection line SSL2". The first and second string selection lines SSL1 and SSL2 may be alternately disposed in the second direction D2. The first and second electrode structures GL1 and GL2 may also be alternately disposed in the second direction D2. Thus, it will be understood that another second electrode structure GL2 may be provided at the right side of the first electrode structure GL1 in FIG. 5B and that another first electrode structure GL1 may be provided at the left side of the second electrode structure GL2 in FIG. 5B. The vertical pillars, which are coupled to each of the selection lines, may include first vertical pillars PL1 constituting a first column and second vertical pillars PL2 constituting a second column, and the first and second columns may be alternately disposed in the second direction D2.

The sub-interconnections may be provided to connect vertical pillars PL1 and PL2, which are coupled to each adjacent pair of the first and second string selection lines SSL1 and SSL2, to each other in a one-to-one manner. The sub-interconnections may include a first sub-interconnection SBL1 and a second sub-interconnection SBL2. The first sub-interconnection SBL1 may connect the second vertical pillar PL2 that is coupled to one of the first string selection lines SSL1 to the first vertical pillar PL1 that is coupled to the second string selection line SSL2, and the second sub-interconnection SBL2 may be provided to connect the second vertical pillar PL2 that is coupled to the second string selection line SSL2 to the first vertical pillar PL1 that is coupled to another of the first string selection lines SSL1.

The sub-interconnections SBL1 and SBL2 may be connected to the vertical pillars PL1 and PL2 through the lower contacts 152. The lower contacts 152 may vertically overlap respective ones of the vertical pillars PL1 and PL2. Herein, a first structure that is formed on an underlying substrate "vertically overlaps" a second structure that is formed on the substrate if a line that is perpendicular to a plane defined by the top surface of the substrate bisects both the first and second structures. The first sub-interconnection SBL1 and the second sub-interconnection SBL2 may each be structures that are elongated in the second direction D2. The first sub-interconnection SBL1 may include a first protruding portion P1 that protrudes in the first direction D1, and the second sub-interconnection SBL2 may include a second protruding portion P2 that protrudes in a direction opposite the first direction D1. In some embodiments, the protruding portions P1 and P2 may be positioned above the insulating separation layer 141 that is between the electrode structures GL1 and GL2, as shown in FIG. 5A.

A plurality of first sub-interconnections SBL1 may be provided that are spaced apart from each other along the first direction D1. A plurality of second sub-interconnections SBL2 may be provided that are also spaced apart from each other along the first direction D1. The first and second sub-interconnections SBL1 and SBL2 may be alternately disposed in the second direction D2. The first sub-interconnections SBL1 and the second sub-interconnections SBL2 may be respectively connected to different ones of the bit lines that are provided adjacent each other. For example, the first sub-interconnections SBL1 may be connected to the first bit line BL1, whereas the second sub-interconnections SBL2 may be connected to the second bit line BL2.

The bit lines BL1 and BL2 may be connected to the sub-interconnections SBL1 and SBL2 through the upper contacts 154. The upper contacts 154 may vertically overlap the insulating separation layers 141 that are provided between the electrode structures GL1 and GL2.

Figure 6A:
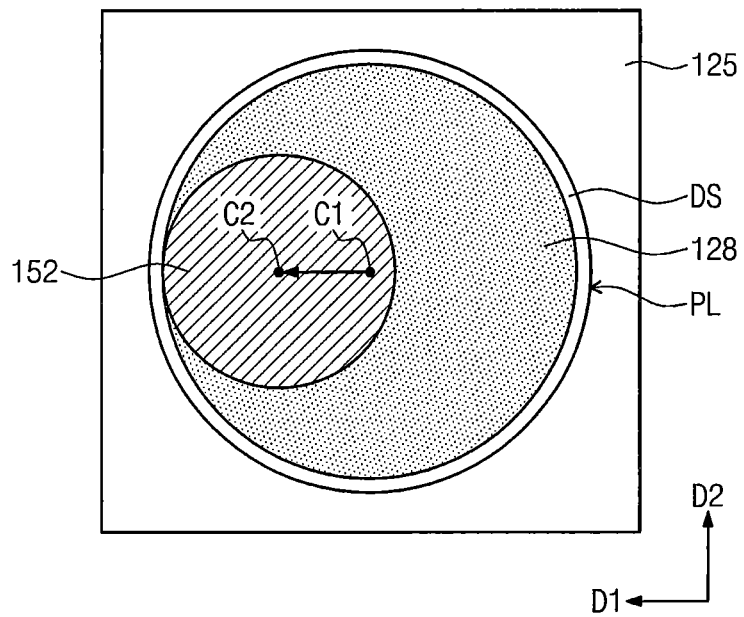
FIGS. 6A and 6B are schematic diagrams illustrating lower contacts, whose centers are offset from centers of vertical pillars thereunder according to example embodiments of the inventive concepts.
Figure 8A:
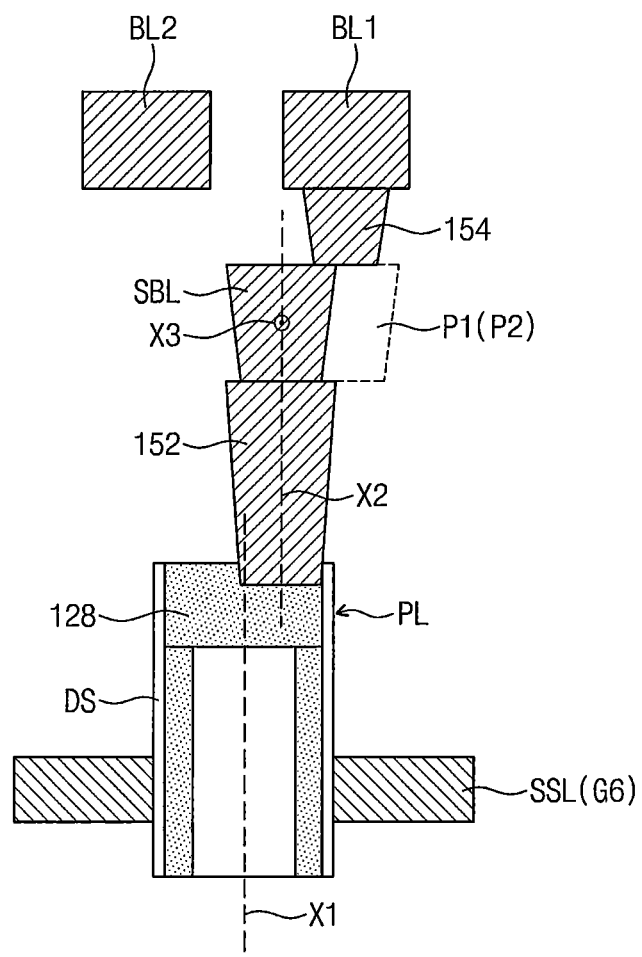
FIGS. 8A and 8B are sectional and plan views, respectively, illustrating relative configurations of a vertical pillar, a lower contact, and a sub-interconnection according to example embodiments of the inventive concepts.

As shown in FIG. 5A, each of the lower contacts 152 may be shifted, in the first direction D1 or an opposite direction thereof, with respect to a corresponding one of the vertical pillars PL1 and PL2 thereunder. Such a shifting of the lower contacts 152 may be realized in various manners. As an example, each of the lower contacts 152 may be shifted in such a way that, when viewed in a plan view, a center C2 of a top (or bottom) surface thereof is offset from a center C1 of a top surface of the vertical pillar PL thereunder in a specific direction, as illustrated in FIG. 6A. As another way of viewing this shift, each of the lower contacts 152 may be shifted in such a way that a central axis X2 thereof is offset from a central axis X1 of the vertical pillar PL in a specific direction, as shown in FIG. 8A. Herein, the central axis of a structure refers to an imaginary line passing through centers of horizontal cross-sections of the structure, where a horizontal cross-section is a cross-section taken in a plane that is parallel to the plane defined by the top surface of the substrate on which the structure is formed.

Lower contacts 152 that are connected to the same sub-interconnection may be shifted in the same manner (e.g., in the same direction). For example, the lower contacts 152 that are connected to the first sub-interconnections SBL1 may be shifted in the first direction D1 with respect to the vertical pillars PL1, PL2 that they vertically overlap, and the lower contacts 152 that are connected to the second sub-interconnections SBL2 may be shifted in the direction opposite the first direction D1 with respect to the vertical pillars PL1, PL2 that they vertically overlap. In other words, the central axes of the lower contacts 152 that are connected to the first sub-interconnections SBL1 may be shifted in the first direction D1 from the central axes of the vertical pillars PL1 and PL2 thereunder, and the central axes of the lower contacts 152 that are connected to the second sub-interconnections SBL2 may be shifted in the direction opposite the first direction D1 from the central axes of the vertical pillars PL1 and PL2 thereunder. The direction in which the lower contacts 152 are shifted may be the same direction as the direction in which the protruding portions P1 and P2 of the respective first and second sub-interconnections protrude. As an example, the lower contacts 152 that are connected to the sub-interconnections SBL1 that include the first protruding portions P1 that protrude in the first direction D1 may be shifted toward the protrusion direction of the first protruding portions P1, and the lower contacts 152 that are connected to the sub-interconnections SBL2 that include the second protruding portions P2 that protrude in the direction opposite the first direction D1 may be shifted toward the protrusion direction of the second protruding portions P2.

Since the central axes of the lower contacts 152 are offset with respect to the central axes of the vertical pillars PL1 and PL2 thereunder, it is possible to reduce the extent to which portions of the sub-interconnections SBL1 and SBL2 protrude in the first direction or the direction opposite the first direction. The sub-interconnections SBL1 and SBL2 may serve as intermediate lines that connect the vertical pillars to respective ones of the bit lines BL1 and BL2. The sub-interconnections SBL1 and SBL2 include protruding portions that allow the vertical pillars to be connected to the respective ones of the bit lines through the upper contacts 154. According to example embodiments of the inventive concepts, since the lower contacts 152 are shifted, it is possible to reduce the extent to which the protruding portions P1 and P2 of the sub-interconnections SBL1 and SBL2 protrude or "bend" in the first direction or the direction opposite the first direction. The greater the extent to which the sub-interconnections SBL1 and SBL2 bend, the more difficult it is to form the sub-interconnections SBL1 and SBL2 and the higher the probability that an electrical short circuit is formed at the bending portion. According to example embodiments of the inventive concepts, by offsetting the central axes of the lower contacts 152 with respect to the central axes of their underlying vertical pillars PL1, PL2, it is possible to reduce the amount that the sub-interconnections SBL1 and SBL2 bend, which may simplify the fabrication process and increase the reliability of the semiconductor memory device.

Figure 5C:
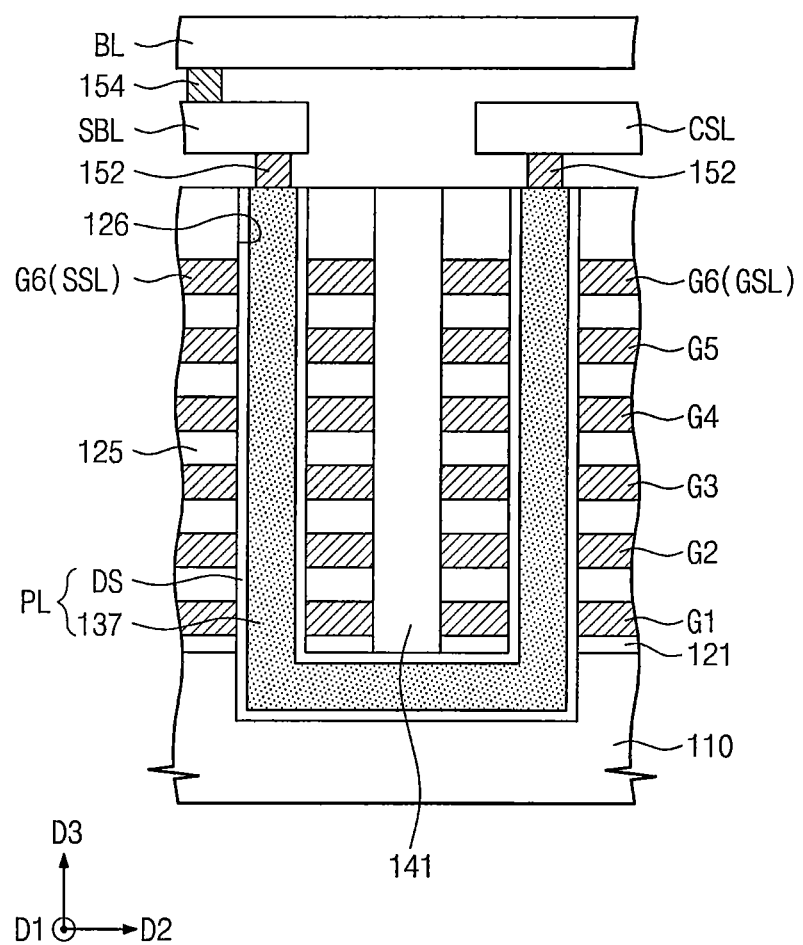
FIG. 5C is a sectional view illustrating a semiconductor memory device according to further example embodiments of the inventive concepts.

FIG. 5C is a sectional view illustrating a semiconductor memory device according to further example embodiments of the inventive concepts. For concise description, a previously described element may be identified by a similar or identical reference number without repeating the description thereof.

Referring to FIG. 5C, the gate electrodes G1-G6 may be separated from each other in the second direction by the insulating separation layer 141. The uppermost one (e.g., G6) of the gate electrodes may include the string selection line SSL and the ground selection line GSL, which are separated from each other in the second direction by the insulating separation layer 141. A plurality of vertical holes 126 penetrate the gate electrodes. A pair of adjacent vertical holes 126 that are separated from each other in the second direction may be connected through a recess region formed in the substrate 110. For example, a vertical hole 126 penetrating the string selection line SSL may be connected to an adjacent vertical hole 126 that penetrates the ground selection line GSL. The vertical pillars PL may be provided in the respective vertical holes 126. The vertical holes 126 may be formed before sacrificial and insulating layers 123 and 124 are formed, which are described herein with reference to FIGS. 14A and 14B; for example, the formation of the vertical holes 126 may include forming a sacrificial layer in the substrate 110 and removing the sacrificial layer prior to formation of the vertical pillars.

Each of the vertical pillars PL may include the memory layer DS and the semiconductor pattern 130, which are sequentially provided in the vertical hole 126. The lower contact 152, a sub-interconnection SBL, and the upper contact 154 may be sequentially provided on each of the vertical pillars PL that penetrate a string selection line SSL to connect these vertical pillars PL to the bit lines BL. The vertical pillars PL that penetrate the ground selection line GSL may be connected to the common source line CSL through the lower contacts 152.

Figure 6B:
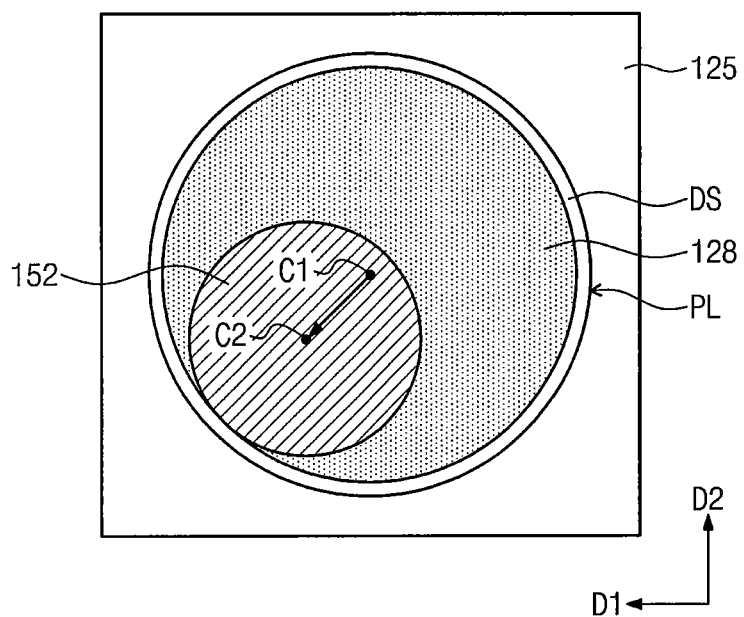

FIGS. 6A and 6B are schematic diagrams illustrating how the centers of the lower contacts 152 may be shifted (i.e., offset) with respect to the centers of the vertical pillars PL thereunder according to example embodiments of the inventive concepts. As shown in FIG. 6A, when viewed in a plan view, the center C2 of the top surface of the lower contact 152 may be shifted in the first direction D1 with respect to the center C1 of the top surface of the vertical pillar PL thereunder. A top surface of the vertical pillar PL may include a top surface of the conductive pattern 128 and a top surface of the memory layer DS, which encloses the top surface of the conductive pattern 128 and is shaped like a ring. The lower contact 152 may not vertically overlap the memory layer DS. In some embodiments, the memory layer DS may not be exposed in the top surface of the vertical pillar PL. In such embodiments, the lower contact 152 may include a portion that does not vertically overlap the top surface of the vertical pillar PL.

As shown in FIG. 6B, in some embodiments, the lower contact 152 may be shifted in a direction that is not parallel to the first direction D1 and is across the second direction and parallel to the top surface of the substrate 110. As an example, the lower contact 152 may be shifted in such a way that a vector representing the shift direction thereof is expressed by two non-vanishing components in both of the first and second directions.

Figure 7:
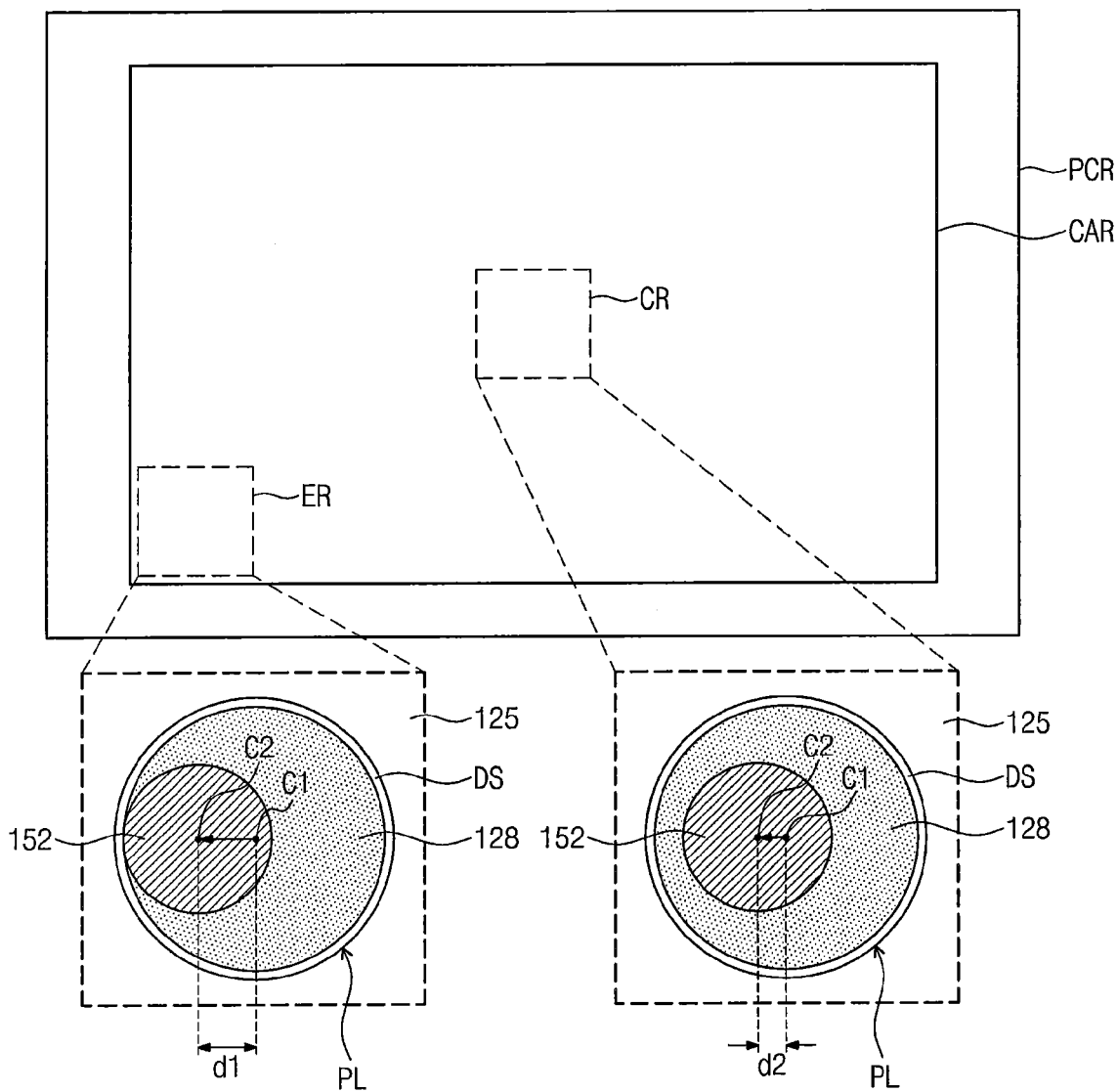
FIG. 7 is a schematic diagram illustrating an example of a variation in shift distance according to a position of a lower contact according to example embodiments of the inventive concepts.

FIG. 7 is a schematic diagram illustrating an example of a variation in shift distance that may occur according to a position of a lower contact within a memory cell array according to example embodiments of the inventive concepts.

According to example embodiments of the inventive concepts, the semiconductor memory device may include a cell array region CAR that has a plurality of memory cells and a peripheral circuit region PCR that may be positioned, for example, near at least one side of the cell array region CAR. For example, the decoders and/or the peripheral circuits described with reference to FIG. 1 may be provided in the peripheral circuit region PCR. The cell array region CAR may include an edge region ER that is adjacent the peripheral circuit region PCR and a center region CR at a center of the cell array region CAR. A shift distance d1 of lower contacts 152 that are provided in the edge region ER may be greater than a shift distance d2 of the lower contacts 152 that are provided in the center region CR. A difference in pattern density and/or constituent layers between the cell array region CAR and the peripheral circuit region PCR may lead to a stress at an interface therebetween, and such a stress may make it difficult to electrically connect the vertical pillars PL to the bit lines BL. Accordingly, the extent to which the sub-interconnections in the edge region ER are bent may be greater than the extent to which the sub-interconnections in the center region CR are bent. In some embodiments, the lower contacts 152 may have a shift distance that is based on a position of each lower contact 152 in the cell array region CAR, and this may make it possible to adaptively or differently control the bending extent of the sub-interconnections, depending on the position of the lower contact 152 in the cell array region CAR. In certain embodiments, the shift distance d1 of the lower contacts 152 in the edge region ER may be equal to or less than the shift distance d2 of the lower contacts 152 in the center region CR.

Figure 8B:
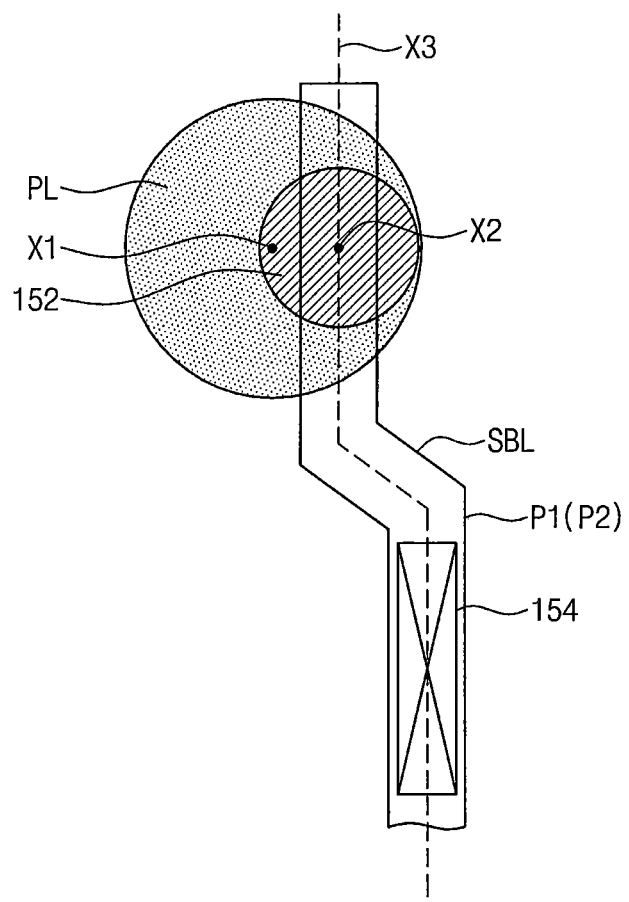

FIGS. 8A and 8B are sectional and plan views, respectively, illustrating relative configurations of a vertical pillar, a lower contact, and a sub-interconnection according to example embodiments of the inventive concepts. Referring to FIGS. 8A and 8B, the central axis X2 of the lower contact 152 may be offset with respect to the central axis X1 of the vertical pillar PL, as described above. In the present embodiments, the sub-interconnection SBL may have a central axis X3 that is substantially aligned with the central axis X2 of the lower contact 152, when viewed in a plan view. In the present specification, when a central axis is expressed to be substantially aligned with another central axis, this expression is not limited to the case where the central axes are perfectly coincident with each other. For example, such an expression may refer to situations in which the central axes are offset from each other by a distance equal to or less than 10% of a diameter of the top surface of the vertical pillar PL. Similarly, when a central axis is expressed to be "shifted" or "offset" from another central axis, this expression refers to situations in which the central axes are offset from each other by a distance greater than 10% of the diameter of the top surface of the vertical pillar PL.

Figure 9A:
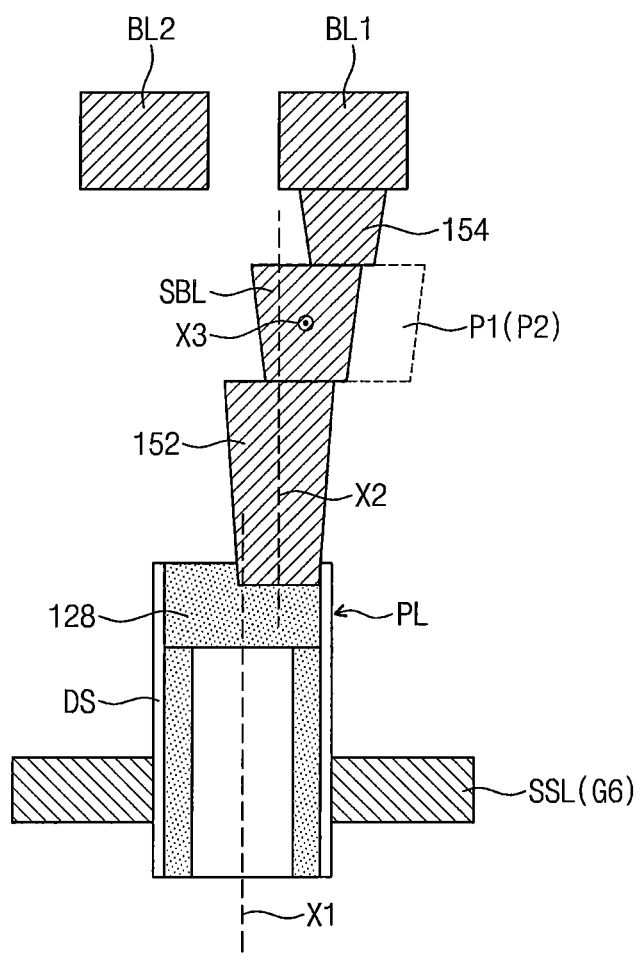
FIGS. 9A and 9B are sectional and plan views, respectively, illustrating relative configurations of a vertical pillar, a lower contact, and a sub-interconnection according to other example embodiments of the inventive concepts.
Figure 9B:
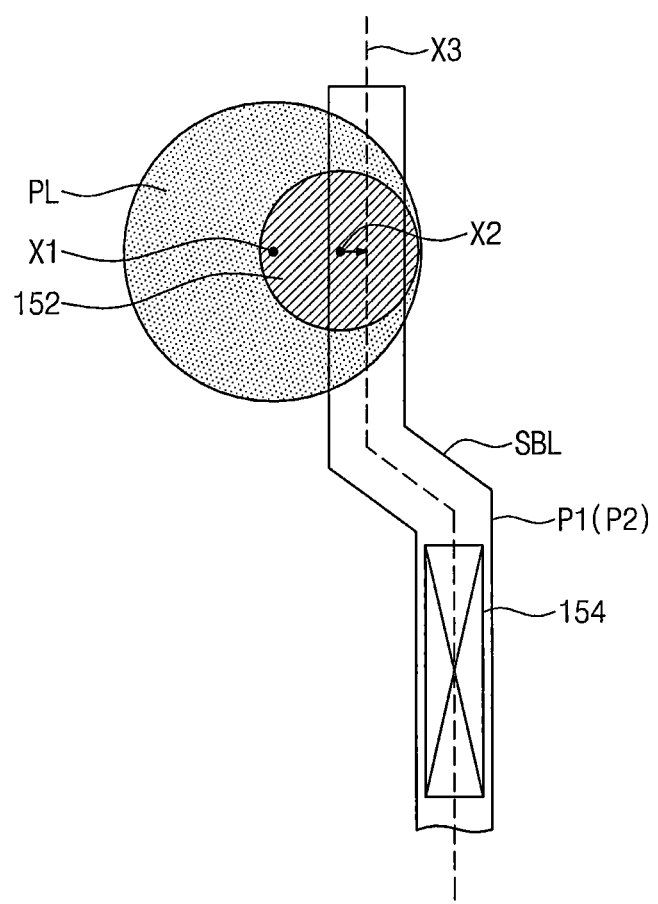

FIGS. 9A and 9B are sectional and plan views, respectively, illustrating relative configurations of a vertical pillar, a lower contact, and a sub-interconnection according to other example embodiments of the inventive concepts. Referring to FIGS. 9A and 9B, when viewed in a plan view, the central axis X3 of the sub-interconnection SBL may be shifted with respect to the central axis X2 of the lower contact 152. The shift direction of the central axis X3 of the sub-interconnection SBL may be substantially the same as the shift direction of the central axis X2 of the lower contact 152 with respect to the central axis X1 of the vertical pillar PL.

Figure 9C:
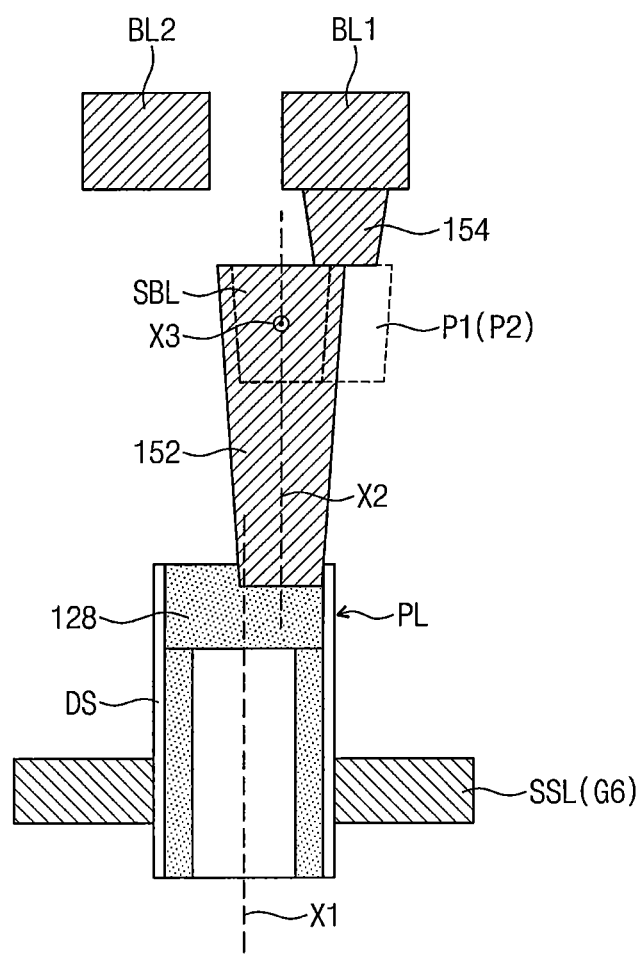
FIG. 9C is a sectional view illustrating a semiconductor memory device according to additional example embodiments of the inventive concepts.

FIG. 9C is a sectional view illustrating a semiconductor memory device according to further example embodiments of the inventive concepts. For concise description, a previously described element may be identified by a similar or identical reference number without repeating the description thereof. In the present embodiment, the sub-interconnection SBL and the lower contacts 152 may be formed at the same time by a dual damascene process, and in this case, a substantive boundary may not be formed between the sub-interconnection SBL and the lower contacts 152. In other words, in this embodiment, the sub-interconnection SBL and the lower contacts 152 may comprise a unitary structure.

Figure 10A:
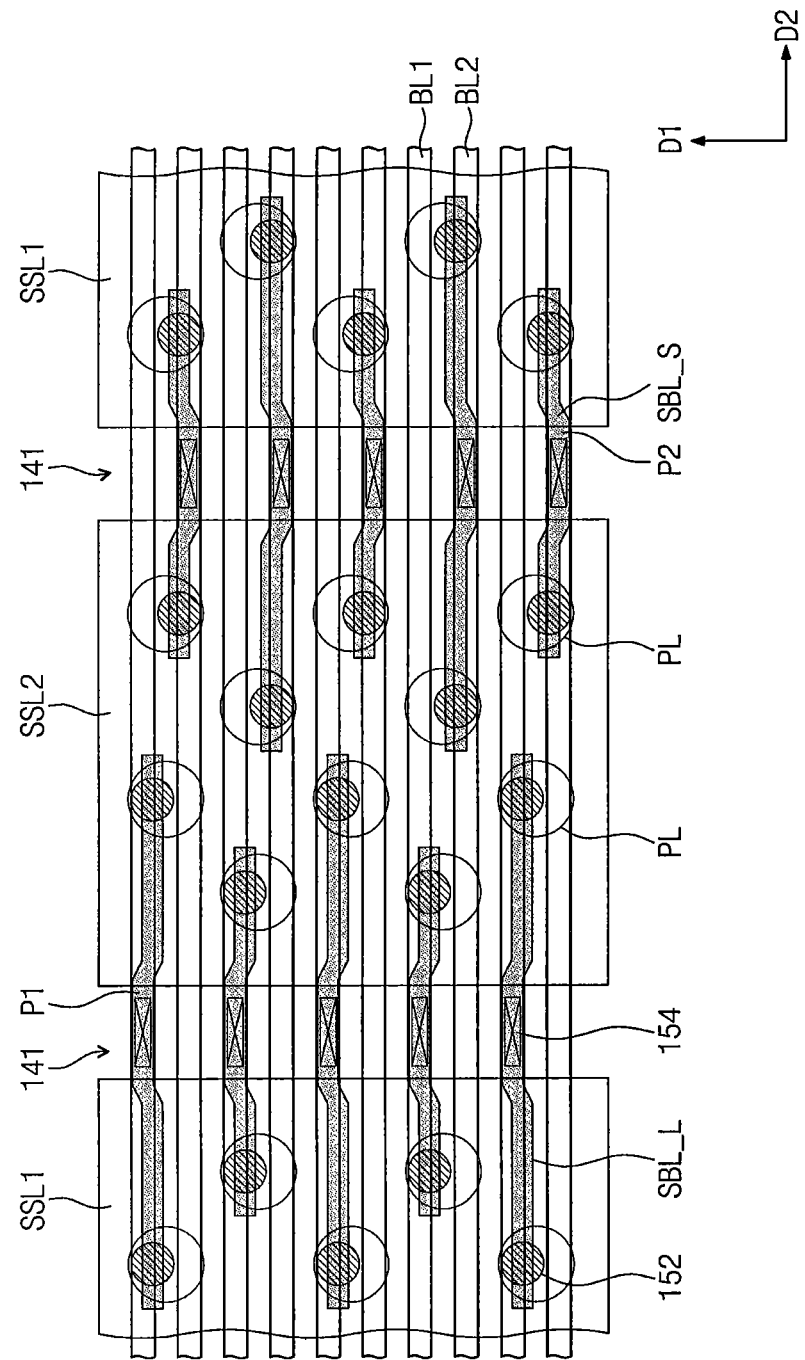
FIG. 10A is a plan view illustrating a semiconductor memory device according to still further example embodiments of the inventive concepts.

FIG. 10A is a plan view illustrating a semiconductor memory device according to still further example embodiments of the inventive concepts. For concise description, a previously described element may be identified by a similar or identical reference number without repeating the description thereof.

The vertical pillars PL may be arranged in a plurality of columns, where each of the columns extends parallel to the first direction D1 and the columns are spaced apart from each other in the second direction D2. In the present embodiment, four columns of vertical pillars penetrate each string selection line SSL1 or SSL2, as is illustrated in the center portion of FIG. 10A. However, example embodiments of the inventive concepts are not limited thereto; for example, the number of columns of vertical pillars PL that penetrate each string selection line is not limited to four. In each pair of adjacent columns, the vertical pillars PL constituting a column may be shifted in the first direction D1 (positively or negatively) from those constituting another column. Accordingly, the vertical pillars PL constituting each pair of adjacent columns may be arranged in a zigzag pattern in the first direction D1 when viewed in plan view (i.e., when viewed from above the substrate). The lower contacts 152 which are provided on the respective vertical pillars PL may likewise be arranged in a zigzag pattern in the first direction D1 when viewed in plan view. For example, the lower contacts 152 that form a first column may be shifted in the first direction D1 with respect to the lower contacts 152 that form an adjacent column.

The shape of the sub-interconnection may be dependent on the arrangements of the vertical pillars PL and the lower contacts 152. As an example, the sub-interconnections may include long sub-interconnections SBL_L for connecting the lower contacts 152 positioned relatively far from the insulating separation layer 141 and short sub-interconnections SBL_S, which are shorter than the long sub-interconnections SBL_L and are used to connect the lower contacts 152 positioned relatively close to the insulating separation layer 141. The long sub-interconnections SBL_L and the short sub-interconnections SBL_S may be alternately provided on each insulating separation layer 141 along the first direction D1.

A pair of the lower contacts 152 may be connected to each of the sub-interconnections SBL_L and SBL_S, and the lower contacts 152 of each pair may be shifted with respect to their underlying vertical pillars by the same amount in the first direction D1 or in the direction opposite to the first direction D1. In some embodiments, the lower contacts 152, which are connected to the sub-interconnections disposed on each insulating separation layer 141, may be equally shifted in the first direction D1 or in the direction opposite to the first direction D1. For example, as shown in FIG. 10A, some of the sub-interconnections may be provided on the insulating separation layer 141 positioned at a left side of the second string selection line SSL2, and the lower contacts 152 connected to such sub-interconnections may be shifted in the first direction D1 with respect to their underlying vertical pillars. In contrast, others of the sub-interconnections may be provided on the insulating separation layer 141 positioned at a right side of the second string selection line SSL2, and the lower contacts 152 connected to such sub-interconnections may be shifted in the direction opposite to the first direction D1 with respect to their underlying vertical pillars.

Figure 10B:
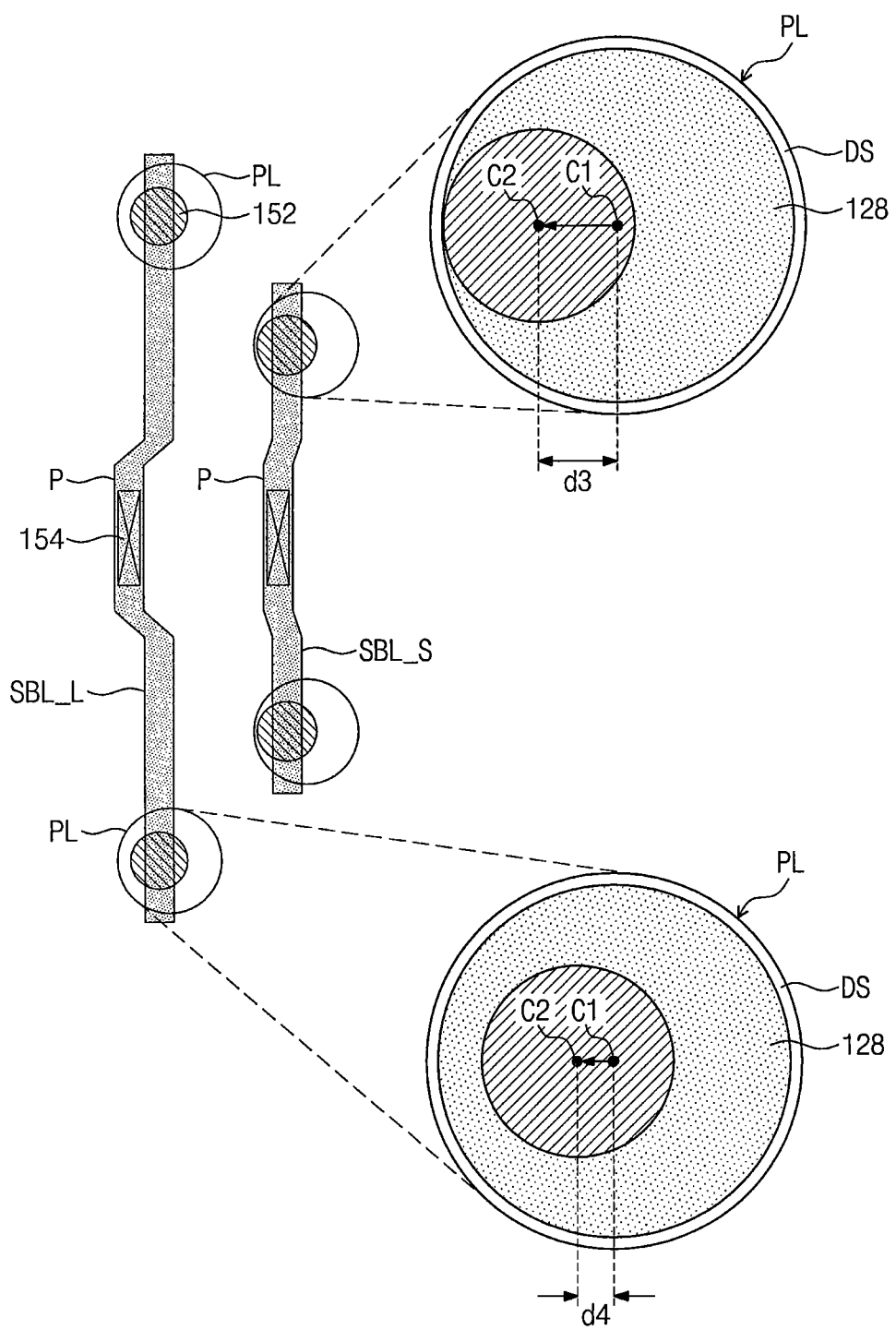
FIG. 10B is a plan view illustrating a long sub-interconnection, a short sub-interconnection, and lower contacts provided thereunder according to example embodiments of the inventive concepts.

FIG. 10B is a plan view illustrating a long sub-interconnection SBL_L, a short sub-interconnection SBL_S, and lower contacts 152 provided thereunder according to example embodiments of the inventive concepts.

The short sub-interconnection SBL_S may be more vulnerable to bending as compared to the long sub-interconnection SBL_L. For example, an electrical short circuit may occur more easily at a bent portion of a short sub-interconnection SBL_S as compared to a bent portion of a long short sub-interconnection SBL_L. Thus, it may be advantageous to form the protruding portion P of the short sub-interconnection SBL_S to have a protrusion length that is smaller than that of the protruding portion P of the long sub-interconnection SBL_L, as shown in FIG. 10B. In the present embodiment, a shift distance d3 of the lower contacts 152 that are connected to the short sub-interconnection SBL_S may be greater than a shift distance d4 of the lower contacts 152 that are connected to the long sub-interconnection SBL_L. By shifting the lower contacts 152 that connect to the short sub-interconnections SBL_S farther it is possible to reduce the extent to which the short sub-interconnections SBL_S are bent as compared to the long sub-interconnections SBL_L.

Figure 11:
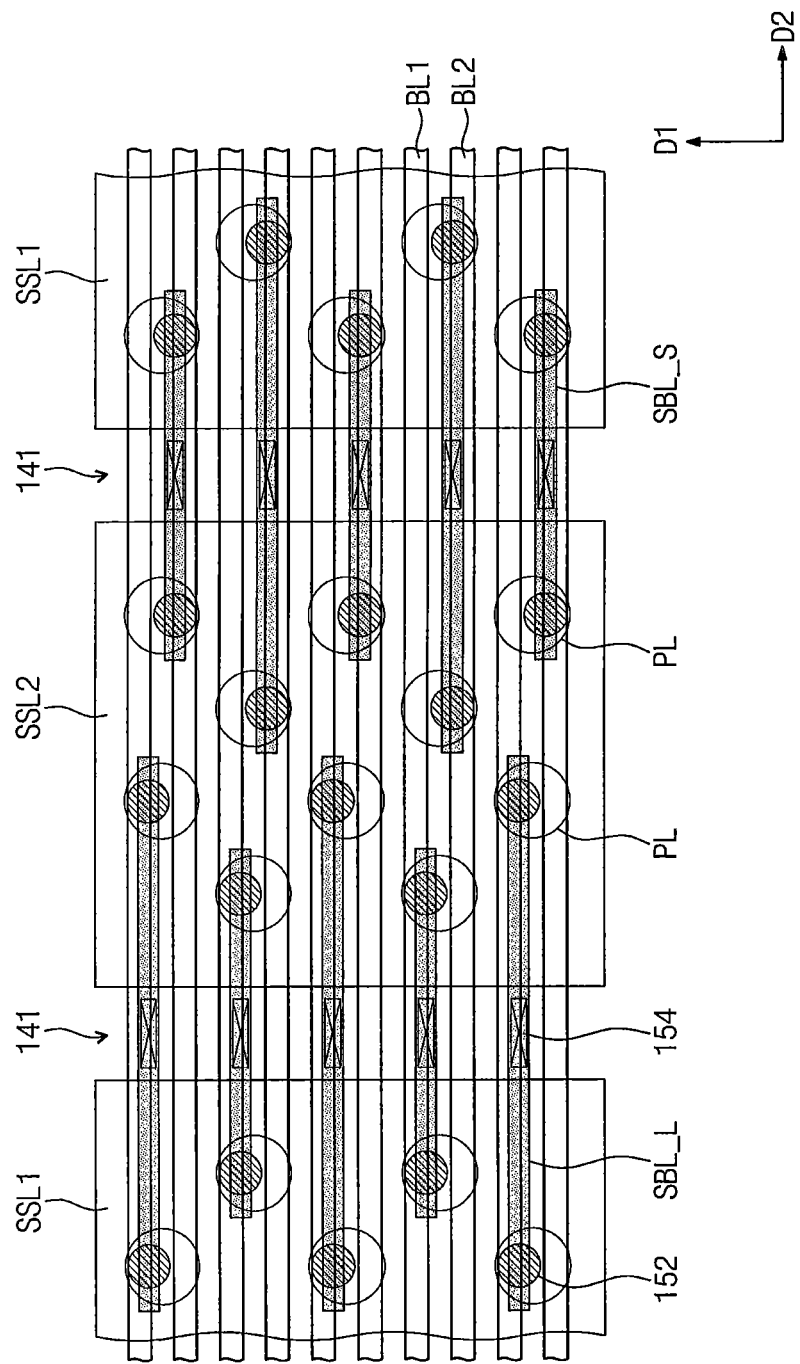
FIG. 11 is a plan view illustrating a semiconductor memory device according to yet additional example embodiments of the inventive concepts.

FIG. 11 is a plan view illustrating a semiconductor memory device according to example embodiments of the inventive concepts. For concise description, a previously described element may be identified by a similar or identical reference number without repeating the description thereof.

Referring to FIG. 11, unlike the previous embodiments of FIGS. 5A and 10A, the sub-interconnections SBL_L and SBL_S may be linear (i.e., they do not have protruding portions). In some embodiments, since the lower contacts 152 are offset with respect to their respective vertical pillars PL, it is possible to eliminate the need to bend the sub-interconnections. Except for the above-described differences, the semiconductor memory device according to the present embodiment may be substantially the same as that of FIG. 10A.

Figure 12:
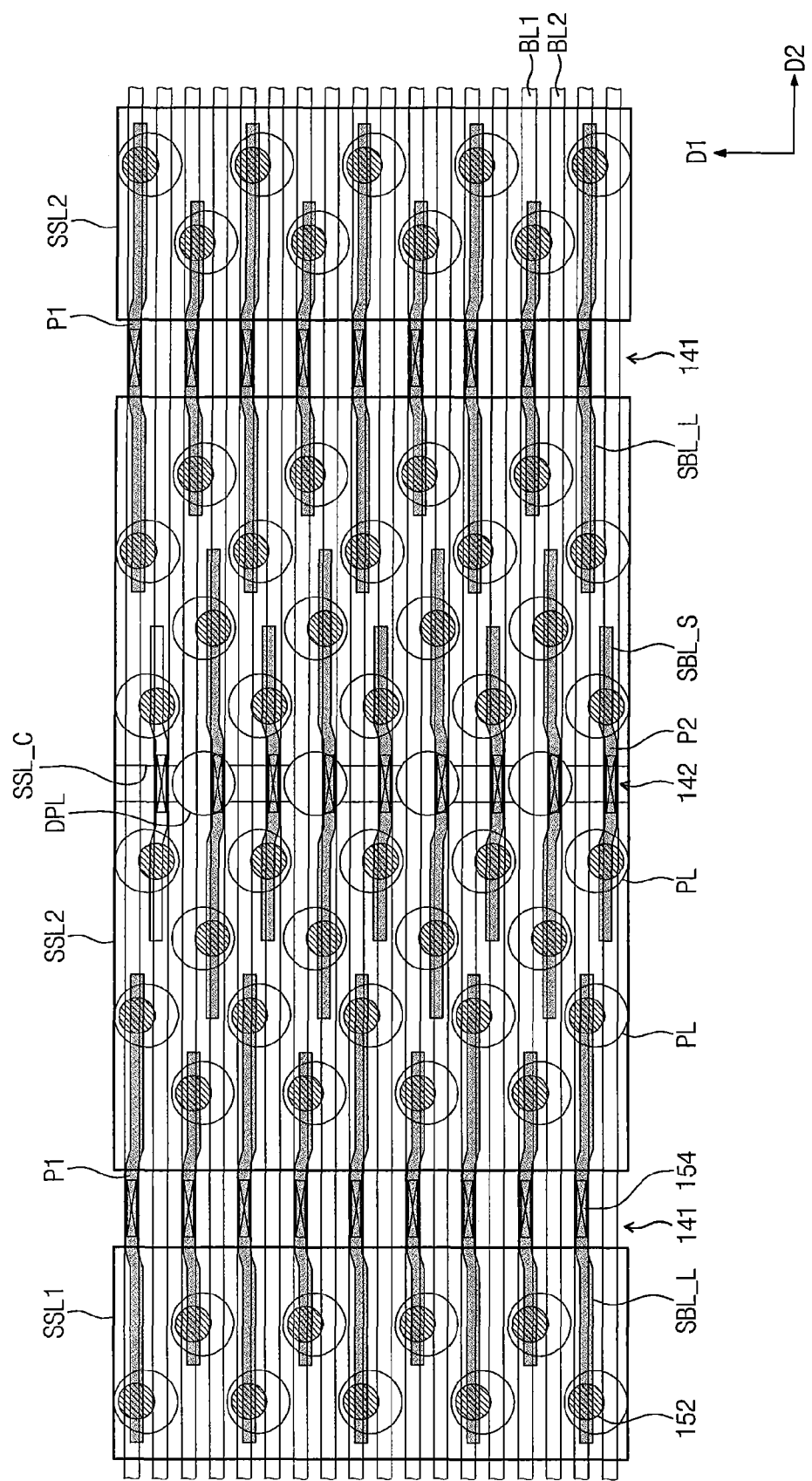
FIG. 12 is a plan view illustrating a semiconductor memory device according to still other example embodiments of the inventive concepts.

FIG. 12 is a plan view illustrating a semiconductor memory device according to still other example embodiments of the inventive concepts. For concise description, a previously described element may be identified by a similar or identical reference number without repeating the description thereof.

In the present embodiment, the electrode structures GL may be defined by first insulating separation layers 141 that penetrate the first to sixth gate electrodes and are connected to the substrate, and each of the electrode structures GL may include a string isolation region SSL_C, which penetrates the uppermost one (e.g., the string selection line) of the gate electrodes to divide the string selection line into the first and second string selection lines SSL1 and SSL2. A second insulating separation layer 142 may be provided in the string isolation region SSL_C. The string isolation region SSL_C may divide the string selection line into two separate string selection lines SSL1 and SSL2, but may not divide the remaining gate electrodes that are under the string selection line. For example, the second insulating separation layer 142 may have a bottom surface that is higher than the top surface of the fifth gate electrode G5 of FIG. 5B and lower than the bottom surface of the sixth gate electrode G6.

In some aspects of the inventive concepts, the insulating separation layer may include the first and second insulating separation layers 141 and 142, which are separated from each other in the second direction D2 to define the string selection lines. At least one of the insulating separation layers 141 and 142, which are spaced apart from each other in the second direction D2, may be used to separate the word lines (e.g., the gate electrodes G2 through G5) from each other in the second direction D2. In the present embodiment, the first insulating separation layer 141 may be used to separate the word lines from each other in the second direction D2, whereas the second insulating separation layer 142 may be used to separate the string selection lines from each other. The first and second insulating separation layers 141 and 142 may be alternately provided in the second direction D2.

A protrusion direction of the sub-interconnections, which are provided on odd-numbered ones of the insulating separation layers (e.g., the first insulating separation layer 141), may be opposite to a protrusion direction of the sub-interconnections, which are provided on even-numbered ones of the insulating separation layers (e.g., the second insulating separation layer 142). As an example, the sub-interconnections that vertically overlap the first insulating separation layer 141 may include the first protruding portions P1 that protrude in the first direction D1, and the sub-interconnections that vertically overlap the second insulating separation layer 142 may include the second protruding portions P2 that protrude in the opposite direction of the first direction D1. The long sub-interconnections SBL_L, which are used to connect the lower contacts 152 that are positioned relatively far from the insulating separation layers 141 and 142, may be longer than the short sub-interconnections SBL_S, which are used to connect the lower contacts 152 that are positioned relatively close to the insulating separation layers 141 and 142.

Dummy vertical pillars DPL may penetrate the second insulating separation layer 142 to divide the second insulating separation layer 142 in the first direction D1. In some embodiments, each of the dummy vertical pillars DPL may have substantially the same structure as that of the vertical pillar PL, but the lower contacts, for connecting the vertical pillars to the sub-interconnections, are not provided on the dummy vertical pillars DPL. For example, in the case where nine columns of the vertical pillars and dummy vertical pillars are provided in the electrode structure, the fifth column may comprise a column of dummy vertical pillars and the first through fourth and sixth through ninth columns may comprise vertical pillars PL.

The sub-interconnections that are on the second insulating separation layer 142 and/or the dummy vertical pillars DPL, may also include the short sub-interconnection SBL_S and the long sub-interconnection SBL_L, similar to the sub-interconnections on the first insulating separation layer 141. The long sub-interconnection on the first insulating separation layer 141 may have substantially the same length as that of the long sub-interconnection on the second insulating separation layer 142, and the short sub-interconnection on the first insulating separation layer 141 may have substantially the same length as that of the short sub-interconnection on the second insulating separation layer 142. In other embodiments, the long sub-interconnection on the second insulating separation layer 142 may be shorter than the long sub-interconnection on the first insulating separation layer 141, and the short sub-interconnection on the second insulating separation layer 142 may be shorter than the short sub-interconnection on the first insulating separation layer 141. In such embodiments, the long sub-interconnection on the second insulating separation layer 142 may be longer than the short sub-interconnection on the first insulating separation layer 141.

Figure 13:
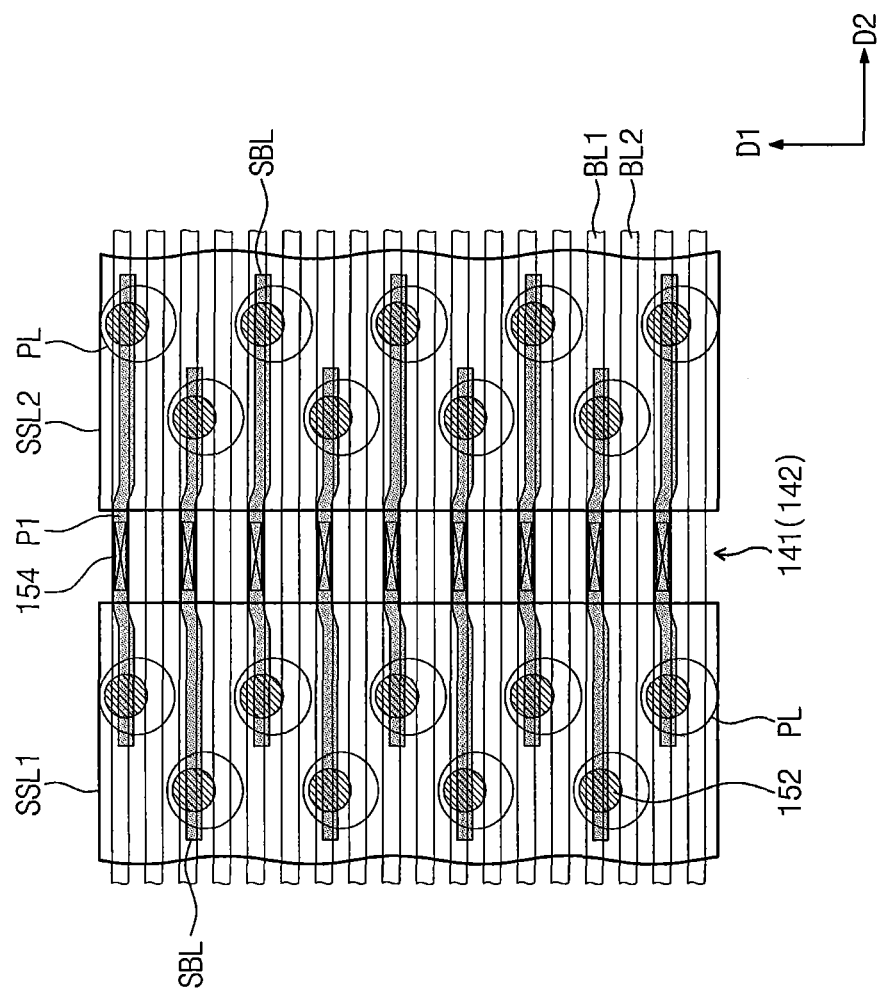
FIG. 13 is a plan view illustrating a semiconductor memory device according to further example embodiments of the inventive concepts.

FIG. 13 is a plan view illustrating a semiconductor memory device according to example embodiments of the inventive concepts. For concise description, a previously described element may be identified by a similar or identical reference number without repeating the description thereof.

In the present embodiment, the vertical pillars PL are arranged in a plurality of columns, where each column extends parallel to the first direction D1 and the columns are spaced apart from each other in the second direction D2. The vertical pillars PL that are included in each column may be shifted in the first direction D1 from the vertical pillars PL that are included in each adjacent column. For example, numbering the columns of vertical pillars shown in FIG. 13 from left to right so that the leftmost column is the first column, each of the vertical pillars PL that are included in an odd-numbered columns (e.g., a first column) may be connected to a corresponding one of the vertical pillars PL of another odd-numbered column (e.g., a third column) through a sub-interconnection SBL, where the two odd-numbered columns are separated by the first insulating separation layer 141 interposed therebetween. Similarly, each of the vertical pillars PL that are included in an even-numbered column (e.g., a second column) may be connected to a corresponding one of the vertical pillars PL of another even-numbered column (e.g., a fourth column) through a sub-interconnection SBL, where the two even-numbered columns are separated by the insulating separation layer 141 interposed therebetween. Numbering the sub-interconnections SBL shown in FIG. 13 from the bottom to the top so that the lowermost sub-interconnections SBL is the first sub-interconnections SBL, it can be seen that each of the odd-numbered ones of the sub-interconnections SBL arranged along the first direction D1 may have a portion that is positioned on the second string selection line SSL2 that is longer than another portion that is positioned on the first string selection line SSL1. Similarly, each of the even-numbered ones of the sub-interconnections SBL may have a portion that is positioned on the first string selection line SSL1 that is longer than another portion that is positioned on the second string selection line SSL2. In some embodiments, the sub-interconnections SBL arranged in the first direction D1 may have substantially the same length.

The structure and arrangement of the sub-interconnections SBL provided on the first insulating separation layer 141 may be applied to the sub-interconnections SBL provided on the second insulating separation layer 142, in substantially the same manner. Furthermore, the structure and arrangement of the sub-interconnections SBL described in the present embodiment may be applied to the previous embodiments of FIGS. 10A, 11, and 12, in substantially the same manner.

FIGS. 14A through 19A are plan views illustrating a process of fabricating a semiconductor memory device according to example embodiments of the inventive concepts. FIGS. 14B through 19B are sectional views taken along lines I-I' of FIGS. 14A through 19A, respectively. For the sake of brevity, a process of fabricating the semiconductor memory device of FIGS. 5A and 5B will be described with reference to FIGS. 14A through 19A and 14B through 19B, but the fabrication process can be identically or similarly applied to fabricate the semiconductor memory devices according to the other example embodiments of the inventive concepts that are disclosed herein.

Figure 14A:
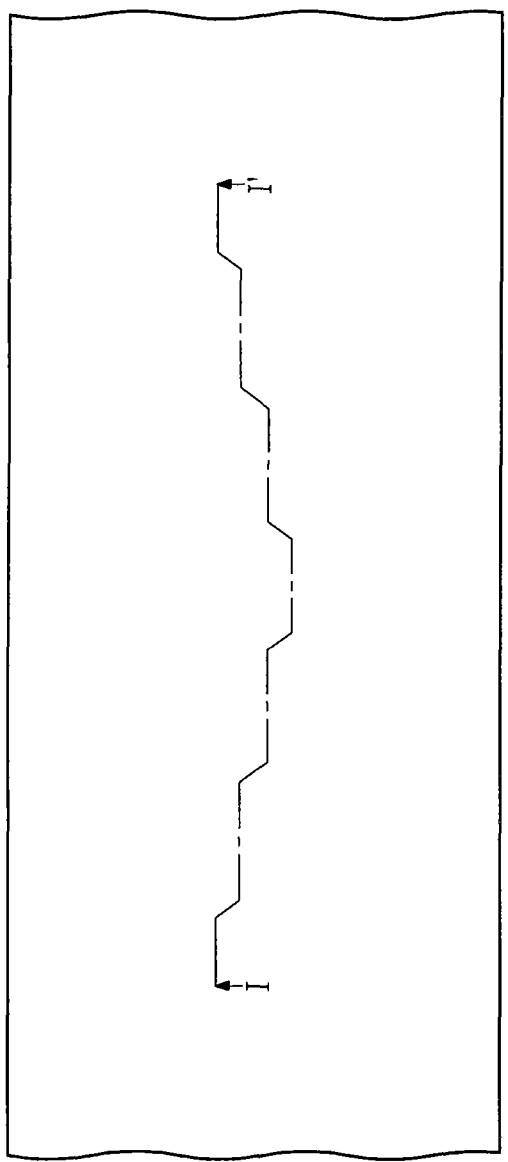
Figure 14B:
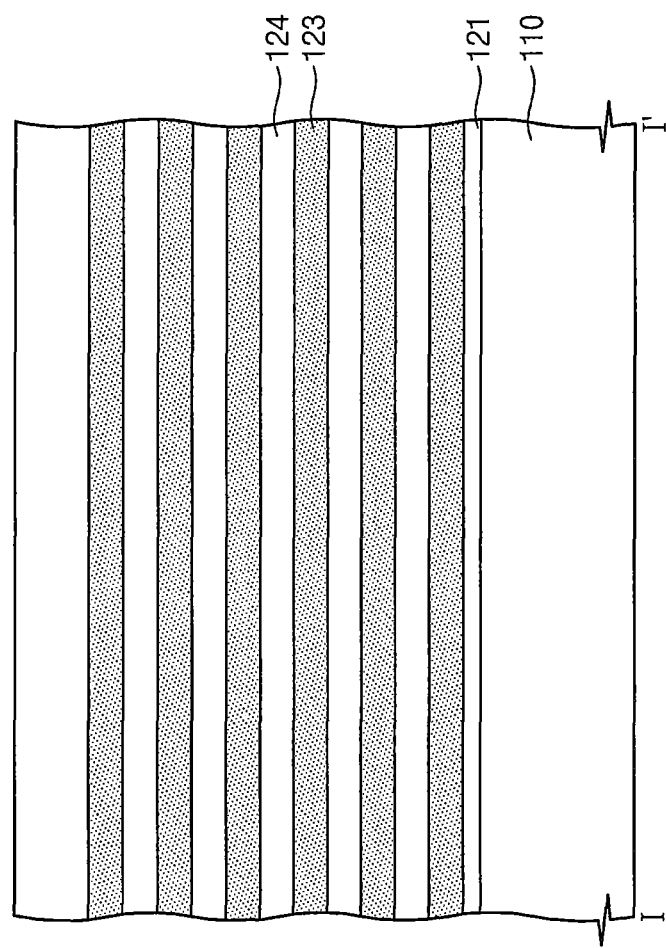

Referring to FIGS. 14A and 14B, the substrate 110 may be provided. The substrate 110 may have a first conductivity type (e.g., p-type). The buffer dielectric layer 121 may be formed on the substrate 110. The buffer dielectric layer 121 may comprise, for example, a silicon oxide layer. The buffer dielectric layer 121 may be formed by, for example, a thermal oxidation process. Sacrificial layers 123 and insulating layers 124 may be alternately stacked on the buffer dielectric layer 121. The uppermost one of the insulating layers 124 may have a thickness that is different from (e.g., greater than) the thickness of the other insulating layers 124. The insulating layers 124 may comprise, for example, a silicon oxide layer. The sacrificial layers 123 may include a material exhibiting wet etching characteristics that are different from that of the buffer dielectric layer 121 and the insulating layers 124. The sacrificial layers 123 may comprise, for example, a silicon nitride layer, a silicon oxynitride layer, a poly-silicon layer, or a polycrystalline silicon-germanium layer. The sacrificial layers 123 and the insulating layers 124 may be formed by, for example, a chemical vapor deposition (CVD) process.

Figure 15A:
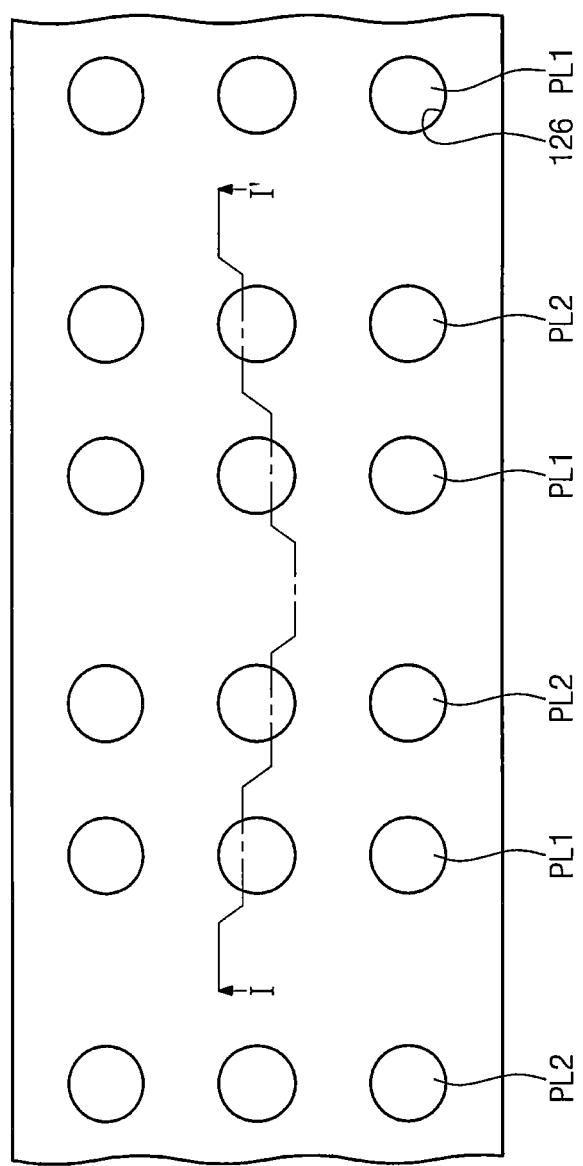
Figure 15B:
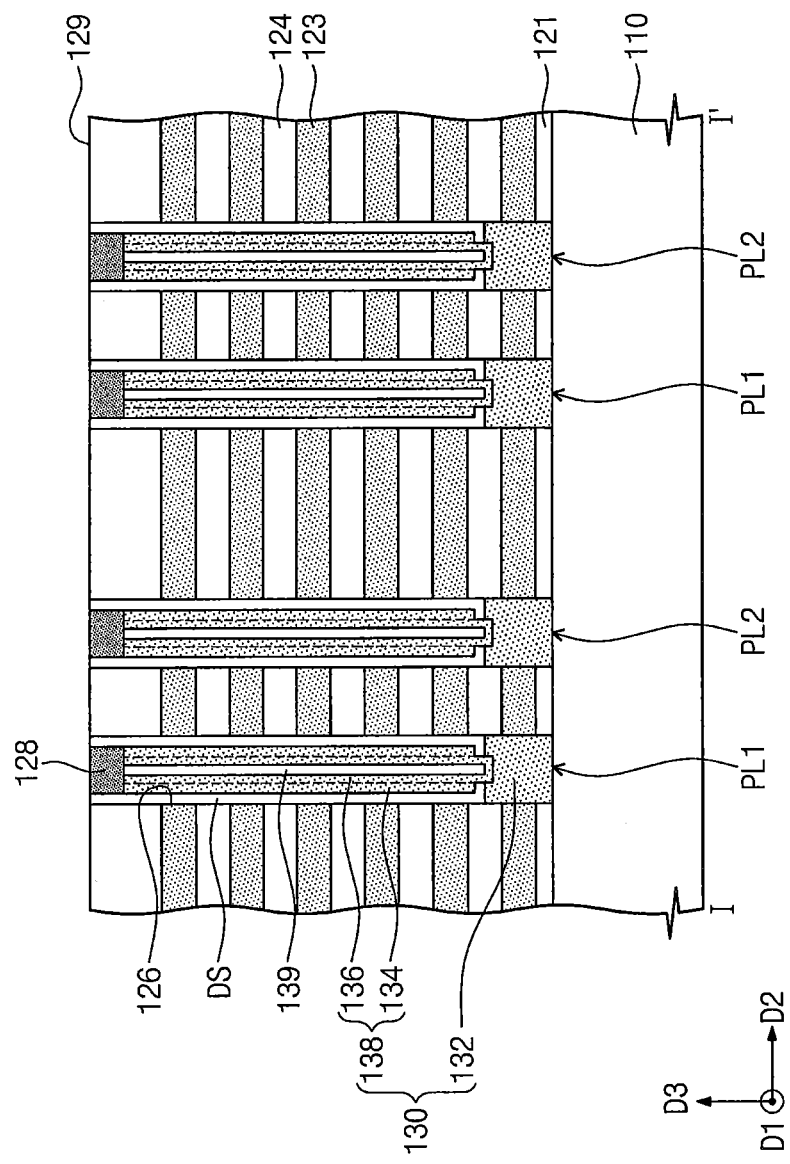

Referring to FIGS. 15A and 15B, vertical holes 126 may be formed to penetrate the buffer dielectric layer 121, the sacrificial layers 123, and the insulating layers 124 to expose the substrate 110. The vertical holes 126 may have the same arrangement as the vertical pillars PL1 and PL2 described with reference to FIG. 5A.

Hereinafter, a method of forming the vertical pillars PL1 and PL2 will be described in more detail. The first semiconductor patterns 132 may be formed in bottom regions of the vertical holes 126, respectively. The first semiconductor patterns 132 may be formed by an epitaxial growth process, in which the top surface of the substrate 110 is used as a seed layer. The first semiconductor patterns 132 may be formed so that the top surfaces thereof are positioned between the top surface of the lowermost layer of the sacrificial layers 123 and the bottom surface of the second lowermost layer of the sacrificial layers 123. The first semiconductor pattern 132 may be epitaxially grown to have substantially a single-crystalline silicon structure. In some embodiments, the first semiconductor patterns 132 may be omitted.

Next, the memory layer DS may be formed in the vertical holes 126 on top of the first semiconductor patterns 132. The memory layer DS may include a blocking insulating layer, a charge storing layer, and a tunnel insulating layer, which are sequentially formed on the sidewalls of the vertical holes 126. The blocking insulating layer may have a multi-layered structure. For example, the blocking insulating layer may include at least two of a hafnium oxide layer, an aluminum oxide layer, or a silicon oxide layer, while a stacking order of the layers can be changed in various manners. The charge storing layer may be formed on the blocking insulating layer. The charge storing layer may be formed by an atomic layer deposition process. The charge storing layer may include a charge trap layer or an insulating layer with conductive nano particles. The charge trap layer may comprise, for example, a silicon nitride layer. The tunnel insulating layer may be formed on the charge storing layer. The tunnel insulating layer may comprise, for example, a silicon oxide layer.

In certain embodiments, at least one of the blocking insulating layer, the charge storing layer, and the tunnel insulating layer constituting the memory layer DS may not be formed in this step, and may instead be formed in a subsequent step (e.g., before the formation of the gate electrodes G1-G6, which will be described with reference to FIGS. 18A and 18B).

A spacer layer may be formed on the memory layer DS and may be anisotropically etched to form the outer patterns 134 on the sidewalls of the vertical holes 126. Each of the outer patterns 134 may comprise a semiconductor material and may have a spacer-like structure. As an example, the outer pattern 134 may comprise silicon. The outer pattern 134 may expose the first semiconductor pattern 132, as the anisotropic etching process of the spacer layer may form openings that penetrate the bottom portion of the memory layer DS to expose the top surface of the first semiconductor pattern 132. Additionally, recessed regions may be formed in top portions of the respective first semiconductor patterns 132 during the anisotropic etching process.

The inner pattern 136 may be formed on the outer pattern 134. The inner pattern 136 may comprise the same material as the outer pattern 134. For example, the outer pattern 134 and the inner pattern 136 may be formed using a chemical vapor deposition process. A thermal treatment step may be performed at least one time during the formation of the outer and inner patterns 134 and 136.

The inner patterns 136 may not completely fill the vertical holes 126, and thus, inner holes may be defined by inner side surfaces of the inner patterns 136. The insulating gap-fill layer 139 may be formed to fill the inner holes. The insulating gap-fill layer 139 may comprise, for example, a silicon oxide layer. For example, the insulating gap-fill layer 139 may be formed of borosilicate glass (BSG), phosphosilicate glass (PSG), or borophosphosilicate (BPSG). Thereafter, a planarization process may be performed on the resulting structure provided with the insulating gap-fill layer 139 to form the inner pattern 136 and the insulating gap-fill layer 139 localized in each of the vertical holes 126. The inner pattern 136 and the outer pattern 134 may together constitute the second semiconductor pattern 138, and the second semiconductor pattern 138 and the first semiconductor pattern 132 may together constitute the semiconductor pattern 130. In certain embodiments, the semiconductor pattern 130 may include at least one of conductive materials, such as metals, conductive metal nitrides, suicides, or nano structures (e.g., carbon nanotube or graphene).

The top portion of the semiconductor patterns 130 may be etched to form recessed regions, and the conductive patterns 128 may be formed in the respective recess regions. The conductive patterns 128 may comprise a doped polysilicon layer or a metal layer. Impurity ions may be injected into the top portions of the conductive and semiconductor patterns 128 and 130 to form drain regions (not shown) having a second conductivity type. In some embodiments, the second conductivity type may be an n-type.

Figure 16A:
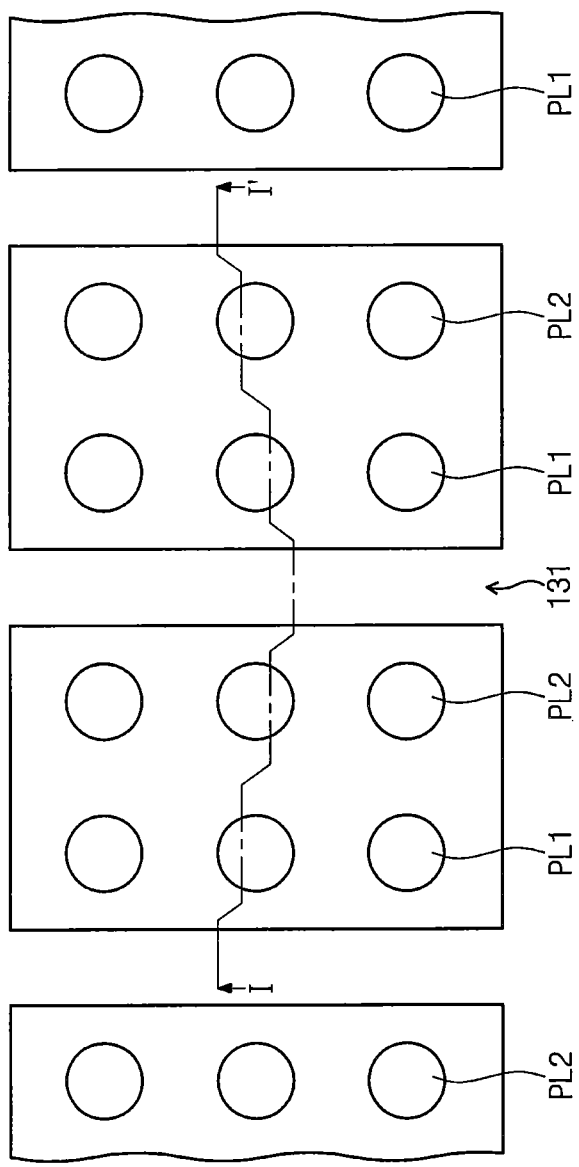
Figure 16B:
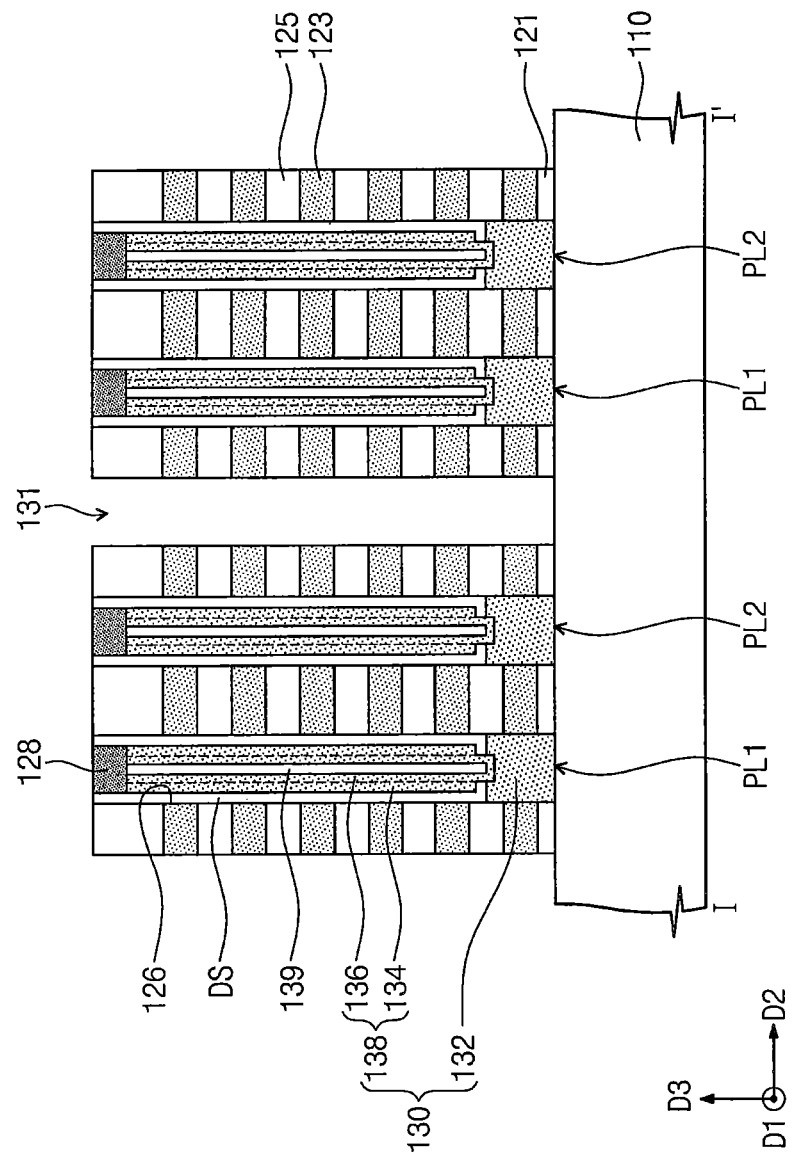

Referring to FIGS. 16A and 16B, the sacrificial layers 123, the insulating layers 124, and the buffer dielectric layer 121 may be sequentially patterned to form the separation trenches 131 that extend in the first direction D1. The separation trenches 131 may expose the substrate 110. The insulating patterns 125 may be formed by pattering the insulating layers 124. The formation of the separation trenches 131 may include an anisotropic etching process.

Figure 17B:
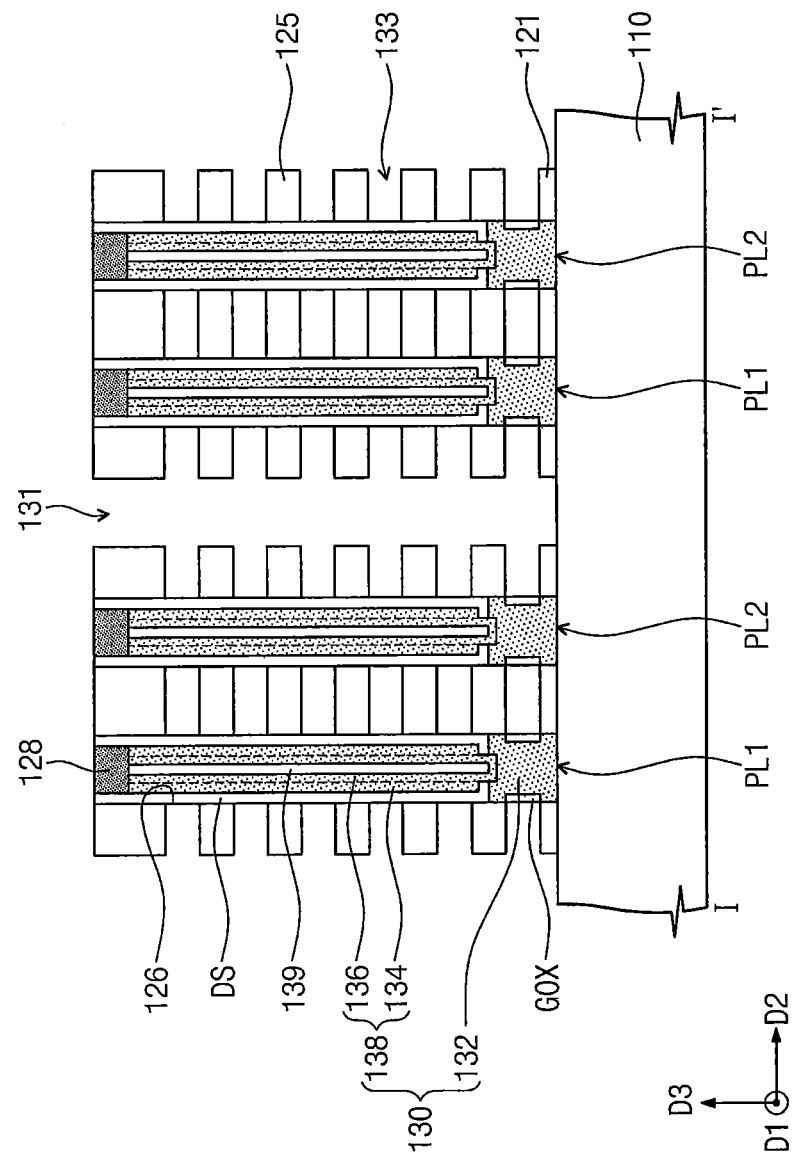

Referring to FIGS. 17A and 17B, the sacrificial layers 123 that are exposed by the separation trench 131 may be selectively removed to form gate regions 133. The gate regions 133, which are formed by removing the sacrificial layers 123, may be delimited by the vertical pillars PL1 and PL2 and the insulating patterns 125. In the case where the sacrificial layers 123 include a silicon nitride layer or a silicon oxynitride layer, the removal of the sacrificial layers 123 may be performed using an etching solution containing phosphoric acid. The gate regions 133 may partially expose the sidewalls of the vertical pillars PL1 and PL2.

The gate oxide GOX may be formed by oxidizing the sidewalls of the first semiconductor patterns 132 that are exposed by the gate region 133. As an example, the gate oxide GOX may be a silicon oxide layer.

Figure 18A:
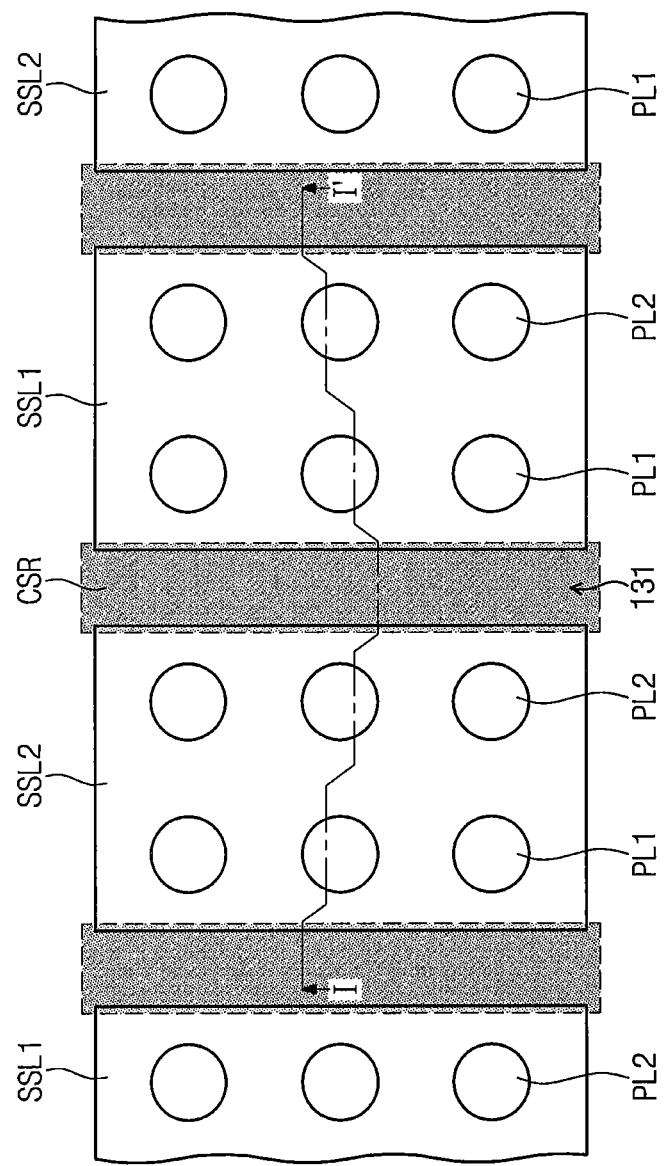
Figure 18B:
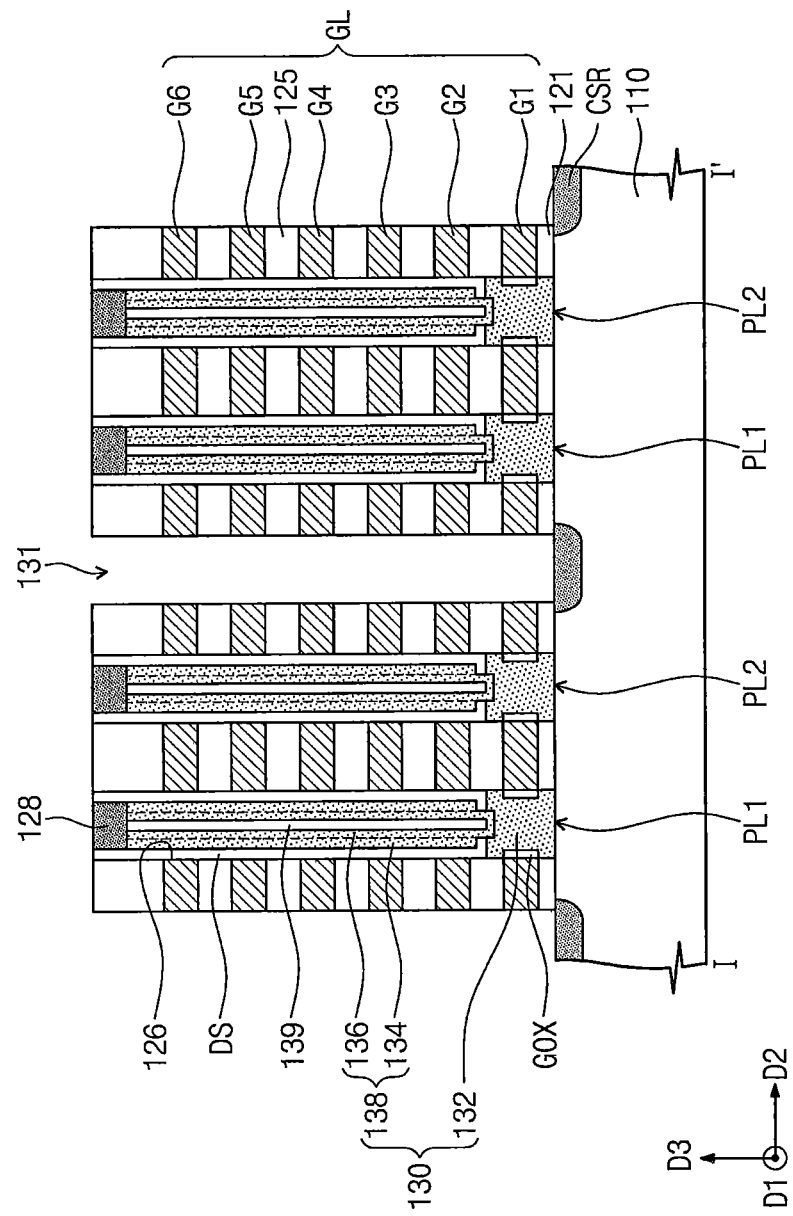

Referring to FIGS. 18A and 18B, conductive layers may be formed in the gate regions 133. These conductive layers may include at least one of a doped silicon layer, a metal layer (e.g., tungsten), a metal nitride layer, or a metal silicide layer. The conductive layers may be formed by, for example, an atomic layer deposition process. In the case where the conductive layers are metal silicide layers, the formation of the conductive layers may include forming polysilicon layers, removing portions of the polysilicon layers that are adjacent the separation trench 131 to form recessed polysilicon layers, forming metal layers on the recessed polysilicon layers, performing a thermal treatment process on the metal layers, and removing an unreacted portion of the metal layers. At least one of tungsten, titanium, cobalt, or nickel may be used as the metal layers for the metal silicide layers.

Portions of the conductive layers that extend outside the gate regions 133 (i.e., into the separation trench 131) may then be removed. Accordingly, the gate electrodes G1-G6 may be formed in the gate regions 133. The gate electrodes G1-G6 may extend in the first direction D1. Each of the electrode structures GL may include the gate electrodes G1-G6.

The conductive layers may be removed from the separation trench 131 to expose the substrate 110, and the exposed regions of the substrate 110 may be highly doped with impurity ions of the second conductivity type to form the common source regions CSR.

Figure 19A:
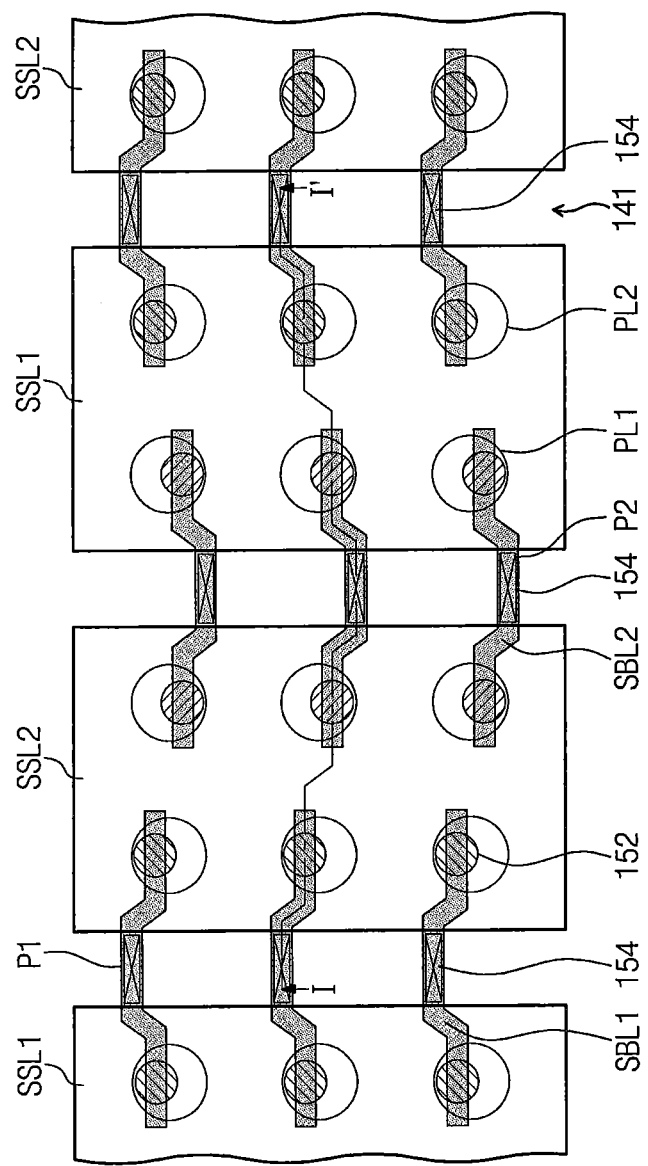
Figure 19B:
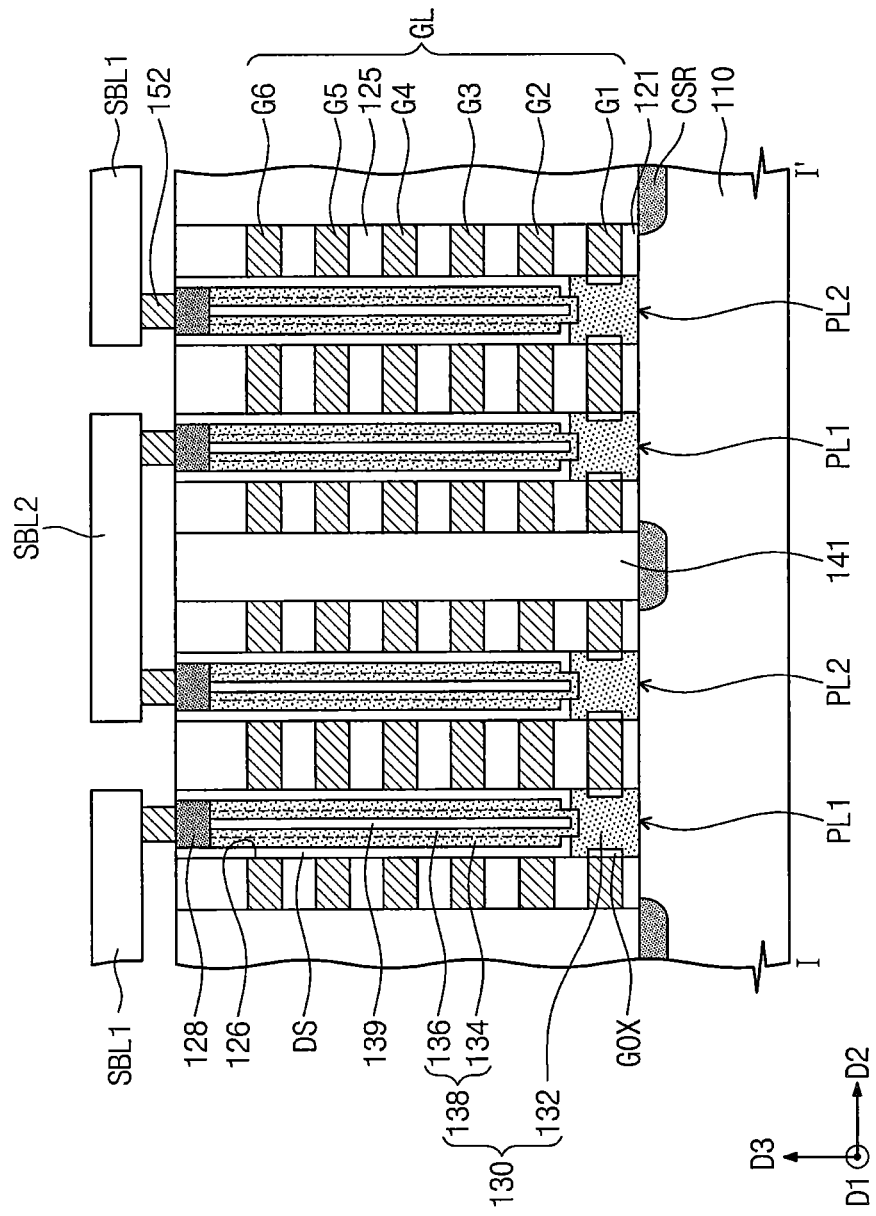

Referring to FIGS. 19A and 19B, the insulating separation layer 141 may be formed to fill the separation trench 131. The lower contacts 152 may be formed on and vertically overlapping the vertical pillars PL1 and PL2. The lower contacts 152 may be formed in the shifted manner described with reference to FIG. 5A. The sub-interconnections SBL1 and SBL2 may be formed on the lower contacts 152. Each of the sub-interconnections SBL1 and SBL2 may connect the vertical pillars PL1 and PL2, which are respectively coupled to the string selection lines SSL1 and SSL2 disposed adjacent each other, in a one-to-one manner through the lower contacts 152.

Referring back to FIGS. 5A and 5B, the upper contacts 154 may be formed on the first sub-interconnection SBL1 and the second sub-interconnection SBL2. The bit lines BL1 and BL2 may be formed on the upper contacts 154. The first sub-interconnection SBL1 and the second sub-interconnection SBL2 may be respectively connected to an adjacent pair of the bit lines through the upper contacts 154. The first sub-interconnection SBL1 may be connected to the first bit line BL1 through an upper contact 154. The second sub-interconnection SBL2 may be connected to the second bit line BL2 through an upper contact 154.

According to example embodiments of the inventive concepts, it is possible to reduce a bending extent of a sub-interconnection and mitigate a difficulty in a process of fabricating a semiconductor memory device. Furthermore, it is possible to reduce or prevent electric short circuits from being formed at the sub-interconnections and consequently to improve reliability of the semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor memory device, comprising:
a substrate having an upper surface that extends in a first direction and in a second direction that is perpendicular to the first direction;

a first electrode structure and a second electrode structure on the upper surface of the substrate that are spaced apart from each other along the second direction;

a plurality of vertical pillars that comprise a first set of vertical pillars and a second set of vertical pillars, the vertical pillars in the first set penetrating through the first electrode structure and the vertical pillars in the second set penetrating through the second electrode structure;

a plurality of lower contacts that vertically overlap and electrically connect to respective ones of the vertical pillars; and a plurality of sub-interconnections that electrically connect respective ones of the vertical pillars in the first set to respective ones of the vertical pillars in the second set, wherein central axes of the lower contacts are offset from central axes of the respective vertical pillars that the lower contacts vertically overlap.

2. The semiconductor memory device of claim 1, further comprising:

a plurality of bit lines extending in the second direction; and a plurality of upper contacts that electrically connect respective ones of the sub-interconnections to respective ones of the bit lines, wherein the sub-interconnections extend in the second direction and include respective protruding portions.

3. The semiconductor memory device of claim 2, wherein the plurality of sub-interconnections comprises a first plurality of sub-interconnections and the plurality of vertical pillars comprises a first plurality of vertical pillars, the semiconductor memory device further comprising:

a third electrode structure on the upper surface of the substrate that is spaced apart from the second electrode structure in the second direction, the second electrode structure being between the first electrode structure and the third electrode structure;

a second plurality of vertical pillars that comprise a third set of vertical pillars and a fourth set of vertical pillars, the vertical pillars in the third set penetrating through the second electrode structure and the vertical pillars in the fourth set penetrating through the third electrode structure; and a second plurality of sub-interconnections that electrically connect respective ones of the vertical pillars in the third set to respective ones of the vertical pillars in the fourth set.

4. The semiconductor memory device of claim 3, wherein the protruding portion of a first of the sub-interconnections in the first plurality of sub-interconnections extends in the first direction, and the protruding portion of a first of the sub-interconnections in the second plurality of sub-interconnections extends in a direction opposite the first direction, and wherein the central axes of the lower contacts are offset from the central axes of the respective vertical pillars that the lower contacts vertically overlap in both the first direction and the second direction.

5. The semiconductor memory device of claim 3, wherein the central axes of first and second of the lower contacts that vertically overlap respective first and second of the vertical pillars that are electrically connected to a first of the sub-interconnections are offset from the central axes of the respective first and second of the vertical pillars in the first direction, and the central axes of third and fourth of the lower contacts that vertically overlap respective third and fourth of the vertical pillars that are electrically connected to a second of the sub-interconnections are offset from the central axes of the respective third and fourth of the vertical pillars in a direction opposite the first direction.

6. The semiconductor memory device of claim 1, wherein the sub-interconnections are spaced apart from each other in the first direction, and wherein a first of the sub-interconnections has a first length in the second direction and a second of the sub-interconnections that is adjacent the first of the sub-interconnections has a second length in the second direction that is greater than the first length.

7. The semiconductor memory device of claim 6, wherein the first of the sub-interconnections is electrically connected to a first of the vertical pillars through a first of the lower contacts and the second of the sub-interconnections is electrically connected to a second of the vertical pillars through a second of the lower contacts, and wherein a central axis of the first of the vertical pillars is offset from a central axis of the first of the lower contacts by a first distance and a central axis of the second of the vertical pillars is offset from a central axis of the second of the lower contacts by a second distance, wherein the first distance is greater than the second distance.

8. The semiconductor memory device of claim 2, wherein the central axes of first and second of the lower contacts that vertically overlap respective first and second of the vertical pillars that are electrically connected to a first of the sub-interconnections are offset from the central axes of the respective first and second of the vertical pillars in the first direction, and wherein the protruding portion of the first of the sub-interconnections extends in the first direction.

9. A semiconductor memory device, comprising:

a substrate having an upper surface that extends in a first direction and in a second direction that is perpendicular to the first direction;

a plurality of vertical pillars that extend above the substrate in a third direction that is perpendicular to the first and second directions, the vertical pillars aligned in a row that extends in the second direction;

a plurality of lower contacts that vertically overlap and electrically connect to respective ones of the vertical pillars; and a first bit line and a second bit line, the first and second bit lines each extending in the second direction and spaced apart from each other in the first direction;

wherein a first subset of the lower contacts that are electrically connected to the first bit line are aligned in a first row that extends in the second direction and a second subset of the lower contacts that are electrically connected to the second bit line are aligned in a second row that extends in the second direction, the first row being spaced apart from the second row in the first direction.

10. The semiconductor memory device of claim 9, wherein central axes of the lower contacts are offset from central axes of the respective vertical pillars that the lower contacts vertically overlap.

11. The semiconductor memory device of claim 9, wherein the vertical pillars are arranged in pairs, the semiconductor memory device further comprising a plurality of sub-interconnections that electrically connect a first vertical pillar of a respective pair to a second vertical pillar of the respective pair.

12. The semiconductor memory device of claim 11, wherein the sub-interconnections that are electrically connected to the first bit line include respective protruding portions that extend in a direction opposite the first direction and the sub-interconnection that are electrically connected to the second bit line include respective protruding portions that extend in the first direction.

13. The semiconductor memory device of claim 12, wherein central axes of the lower contacts that are electrically connected to the first bit line are offset from central axes of the respective vertical pillars that the lower contacts vertically overlap in a direction opposite the first direction and central axes of the lower contacts that are electrically connected to the second bit line are offset from central axes of the respective vertical pillars that the lower contacts vertically overlap in the first direction.

14. The semiconductor memory device of claim 11, wherein a central axis of a first of the lower contacts extends in the third direction and intersects a central axis of a first of the sub-interconnections that is electrically connected to the first of the lower contacts, the central axis of the first of the sub-interconnections extending in a plane defined by the first and second directions.

15. The semiconductor memory device of claim 11, wherein a central axis of a first of the lower contacts extends in the third direction and is offset in the first direction from a central axis of a first of the sub-interconnections that is electrically connected to the first of the lower contacts, the central axis of the first of the sub-interconnections extending in a plane defined by the first and second directions.

16. A semiconductor memory device, comprising:
a substrate having an upper surface; and
a memory cell array, the memory cell array comprising:
   a plurality of vertical pillars that extend upwardly above the substrate; and
   a plurality of lower contacts that vertically overlap and electrically connect to respective ones of the vertical pillars;

wherein central axes of the lower contacts are offset from central axes of the respective vertical pillars that the lower contacts vertically overlap, and wherein the central axis of a first of the lower contacts that is located in a first region of the memory cell array is offset from the central axis of the vertical pillar that the first of the lower contacts vertically overlaps by a first distance and the central axis of a second of the lower contacts that is located in a second region of the memory cell array is offset from the central axis of the vertical pillar that the second of the lower contacts vertically overlaps by a second distance that is different than the first distance.

17. The semiconductor memory device of claim 16, wherein the first region is a central region of the memory cell array and the second region is an edge region of the memory cell array.

18. The semiconductor memory device of claim 17, wherein the second distance exceeds the first distance.

19. The semiconductor memory device of claim 16, wherein the vertical pillars are arranged in pairs, the semiconductor memory device further comprising a plurality of sub-interconnections that respectively electrically connect a first vertical pillar of a respective pair to a second vertical pillar of the respective pair.

20. The semiconductor memory device of claim 19, wherein the sub-interconnections include respective protruding middle portions that are offset from end portions thereof in the same direction that the central axes of the lower contacts that are electrically connected to the respective sub-interconnections are offset from the central axes of the respective vertical pillars that the lower contacts respectively vertically overlap.

\* \* \* \* \*